(12) United States Patent
Okita et al.

(10) Patent No.: US 11,164,936 B2
(45) Date of Patent: Nov. 2, 2021

(54) SEMICONDUCTOR DEVICE FABRICATION METHOD AND SEMICONDUCTOR DEVICE

(71) Applicant: FUJITSU SEMICONDUCTOR LIMITED, Yokohama (JP)

(72) Inventors: Youichi Okita, Aizuwakamatsu (JP); Wensheng Wang, Kuwana (JP); Kazuaki Takai, Kawasaki (JP)

(73) Assignee: FUJITSU SEMICONDUCTOR MEMORY SOLUTION LIMITED, Yokohama (JP)

( * ) Notice: Subject to any disclaimer, the term of this patent is extended or adjusted under 35 U.S.C. 154(b) by 29 days.

(21) Appl. No.: 16/733,542

(22) Filed: Jan. 3, 2020

(65) Prior Publication Data

US 2020/0251551 A1 Aug. 6, 2020

(30) Foreign Application Priority Data

Feb. 1, 2019 (JP) .............................. JP2019-016606

(51) Int. Cl.
*H01L 29/78* (2006.01)
*H01L 29/66* (2006.01)
(Continued)

(52) U.S. Cl.
CPC .......... *H01L 28/57* (2013.01); *H01L 27/1159* (2013.01); *H01L 27/11507* (2013.01); *H01L 29/6684* (2013.01); *H01L 29/78391* (2014.09)

(58) Field of Classification Search
CPC . G11C 11/221; H01L 27/11502–11514; H01L 28/65; H01L 28/55–56;
(Continued)

(56) References Cited

U.S. PATENT DOCUMENTS 6,246,082 B1  6/2001  Mitarai et al.
7,547,558 B2* 6/2009  Okita ................... H01L 28/57
                                                                    438/3
(Continued)

FOREIGN PATENT DOCUMENTS

JP          10-12844 A     1/1998
JP         11-126883 A     5/1999
(Continued)

*Primary Examiner* — Jose R Diaz
(74) *Attorney, Agent, or Firm* — Westerman, Hattori, Daniels & Adrian, LLP

(57) ABSTRACT

A first-layer insulating film having a barrier property against a determined element contained in a ferroelectric capacitor as well as an oxygen permeability, a hydrogen permeability, and a water permeability is formed over a surface of the ferroelectric capacitor formed over a substrate. After that, heat treatment is performed in an oxidizing atmosphere. After the heat treatment, a second insulating film having a hydrogen permeability and a water permeability lower than those of the first-layer insulating film respectively is formed over a surface of the first-layer insulating film in a non-reducing atmosphere. A third-layer insulating film is formed over a surface of the second-layer insulating film. By doing so, degradation of a ferroelectric film under and after the formation of a semiconductor device having the ferroelectric capacitor is suppressed and deterioration in the characteristics of the ferroelectric capacitor is suppressed.

9 Claims, 22 Drawing Sheets

(51) Int. Cl.
*H01L 27/11507* (2017.01)
*H01L 49/02* (2006.01)
*H01L 27/1159* (2017.01)

(58) Field of Classification Search
CPC .......... H01L 29/78391; H01L 29/6684; H01L 28/57; H01L 27/11507
See application file for complete search history.

(56) References Cited

U.S. PATENT DOCUMENTS

2005/0136554 A1    6/2005   Okita et al.
2006/0244022 A1    11/2006  Natori et al.

FOREIGN PATENT DOCUMENTS

| | | |
|---|---|---|
| JP | 2005-183843 A | 7/2005 |
| JP | 2006-310637 A | 11/2006 |
| JP | 2008-34539 A | 2/2008 |
| JP | 2009-105084 A | 5/2009 |

\* cited by examiner

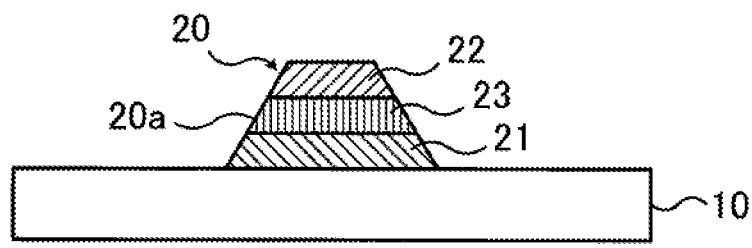
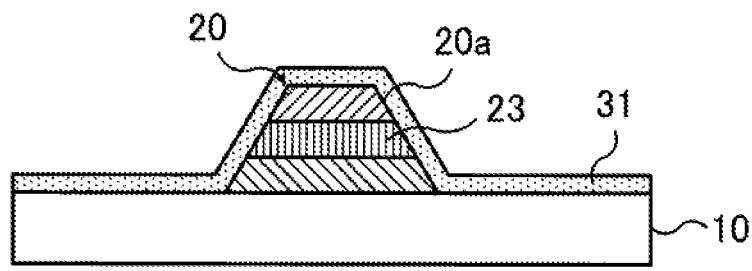
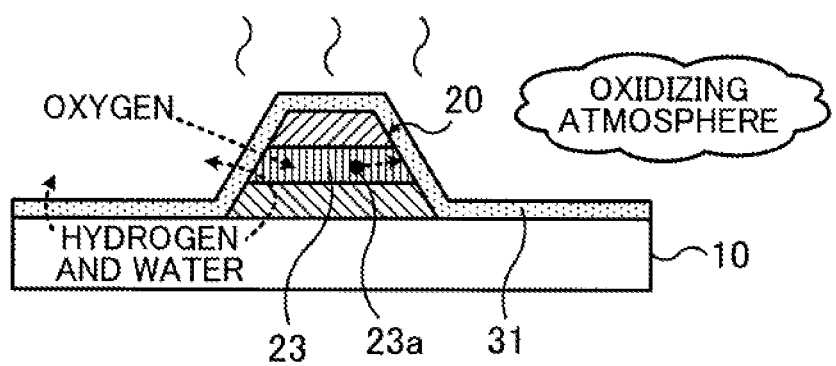
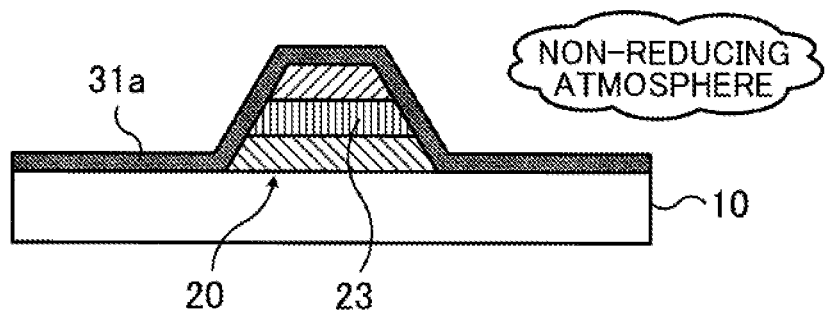
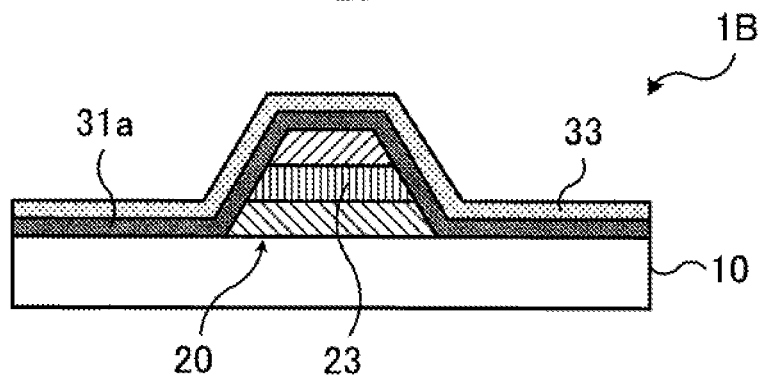

SEMICONDUCTOR DEVICE FABRICATION METHOD AND SEMICONDUCTOR DEVICE

CROSS-REFERENCE TO RELATED APPLICATION

This application is based upon and claims the benefit of priority of the prior Japanese Patent Application No. 2019-016606, filed on Feb. 1, 2019, the entire contents of which are incorporated herein by reference.

FIELD

The embodiments discussed herein are related to a semiconductor device fabrication method and a semiconductor device.

BACKGROUND

A semiconductor device having a ferroelectric capacitor including a lower electrode, an upper electrode, and a ferroelectric film intervening between them is known.

With a semiconductor device having a ferroelectric capacitor, it is known that when a ferroelectric film included in the ferroelectric capacitor is reduced by a reducing substance, such as hydrogen or water, which enters or adheres to the ferroelectric film, the characteristics of the ferroelectric capacitor may deteriorate. The technique of covering the surface of a ferroelectric capacitor with an aluminum oxide film, the technique of alternately laminating a silicon oxide film and an aluminum oxide film so as to cover the surface of a ferroelectric capacitor, or the like is known as a technique for protecting the ferroelectric capacitor against a reducing substance. In addition, the technique of forming over an upper electrode a barrier layer having an amorphous structure and made of TaSiN or the like having hydrogen barrier properties or the technique of forming an upper electrode having two-layer structure, that is to say, having an upper-layer electrode film and a lower-layer electrode film, and removing adsorbed water at an interface between the upper electrode and a ferroelectric film through the lower-layer electrode film by heat treatment before the formation of the upper-layer electrode film is known.

Furthermore, with a semiconductor device having a ferroelectric capacitor, it is known that if heat treatment is performed on the ferroelectric capacitor, a determined element in a ferroelectric film may evaporate by the heat treatment and therefore the characteristics of the ferroelectric capacitor may deteriorate. The technique of covering the surface of the ferroelectric capacitor with an aluminum oxide film, the technique of forming over such a protection film an evaporation compensation film for compensating for the determined element evaporated, or the like is known as a technique for suppressing deterioration in the characteristics of the ferroelectric capacitor caused by the evaporation of the determined element in the ferroelectric film.

See, for example, the following documents:
Japanese Laid-open Patent Publication No. 2009-105084
Japanese Laid-open Patent Publication No. 2006-310637
Japanese Laid-open Patent Publication No. 11-126883
Japanese Laid-open Patent Publication No. 10-12844
Japanese Laid-open Patent Publication No. 2008-34539

By the way, the following technique is known. A first protection film having a certain thickness is formed over the surface of a ferroelectric capacitor by heat treatment, such as recovery anneal, in an atmosphere containing oxygen. A determined element in a ferroelectric film does not virtually pass through the first protection film, but oxygen, hydrogen, and water pass through the first protection film. The heat treatment is performed for forming a second protection film. With this technique, oxygen in the atmosphere is supplied through the first protection film to the ferroelectric film and the transpiration of the determined element from the ferroelectric film is suppressed by the first protection film, at the time of the heat treatment. In addition, hydrogen and water are discharged through the first protection film from the side of the ferroelectric film. The second protection film is formed after the heat treatment so as to cover the first protection film. By doing so, the transpiration of the determined element from the ferroelectric film to the outside of the second protection film is suppressed and the entrance of hydrogen and water from an interlayer insulating film formed outside the second protection film to the side of the ferroelectric film is suppressed. However, if a condition under which a reducing substance, such as hydrogen, is contained in an atmosphere or a material is used for forming the second protection film, the reducing substance enters the ferroelectric film through the first protection film. As a result, the ferroelectric film is reduced and the characteristics of the ferroelectric capacitor may deteriorate.

SUMMARY

According to an aspect, there is provided a semiconductor device fabrication method including forming a ferroelectric capacitor over a substrate, forming over a surface of the ferroelectric capacitor a first insulating film having a barrier property against a first element contained in the ferroelectric capacitor and having an oxygen permeability, a hydrogen permeability, and a water permeability, performing heat treatment in an oxidizing atmosphere after forming the first insulating film, forming over a surface of the first insulating film in a non-reducing atmosphere a second insulating film having a hydrogen permeability and a water permeability lower than the hydrogen permeability and the water permeability, respectively, of the first insulating film after performing the heat treatment, and forming a third insulating film over a surface of the second insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 2A through 2E are views for describing a second example of a method for forming the semiconductor device according to the first embodiment;

DESCRIPTION OF EMBODIMENTS

First Embodiment

FIGS. 1A through 1E are views for describing a first example of a method for forming a semiconductor device according to a first embodiment. Each of FIGS. 1A through 1E is a fragmentary sectional view schematically illustrative of a step of an example of a formation method of a semiconductor device having a ferroelectric capacitor.

Figure 1A:
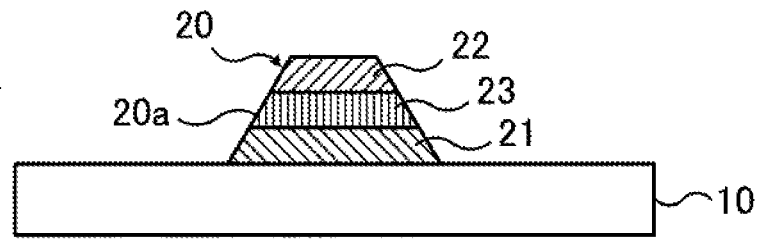
FIGS. 1A through 1E are views for describing a first example of a method for forming a semiconductor device according to a first embodiment.

As illustrated in FIG. 1A, first a ferroelectric capacitor 20 is formed over a substrate 10 in the first example. For example, the substrate 10 includes a semiconductor substrate made of silicon (Si) or the like, semiconductor elements, such as transistors, formed over the semiconductor substrate, and a wiring layer which is formed over the semiconductor substrate and in which conductor portions (such as plugs and wirings) connected to the semiconductor elements are formed in an insulated part (such as an interlayer insulating film) (not illustrated). The ferroelectric capacitor 20 is formed over the above substrate 10. In FIG. 1A and FIGS. 1B through 1E described later, one ferroelectric capacitor 20 is formed over the substrate 10. However, a plurality of ferroelectric capacitors 20 may be formed over the substrate 10.

The ferroelectric capacitor 20 includes a lower electrode 21, an upper electrode 22, and a ferroelectric film 23 intervening therebetween.

The lower electrode 21 is formed by the use of a material such as iridium (Ir). The lower electrode 21 may be formed by the use of a material such as rhodium (Rh), palladium (Pd), or ruthenium (Ru).

The upper electrode 22 is formed by the use of a material such as iridium or iridium oxide ($IrO_2$). The upper electrode 22 may be formed by the use of a material such as rhodium, palladium, ruthenium, rhenium (Re), osmium (Os), rhodium oxide, palladium oxide, ruthenium oxide, rhenium oxide, or osmium oxide. Furthermore, the upper electrode 22 may be formed by the use of a material such as a conductive oxide (strontium ruthenate ($SrRuO_3$ or SRO), for example).

The ferroelectric film 23 is formed by the use of a ferroelectric material such as lead zirconate titanate (Pb(Zr, Ti)$O_3$ or PZT). Lanthanum (La), calcium (Ca), strontium (Sr), or the like may be added to the PZT. The ferroelectric film 23 may be formed by the use of a material such as strontium bismuth tantalate ($SrBi_2Ta_2O_9$ or SBT), strontium bismuth tantalate niobate ($SrBi_2(Ta, Nb)_2O_9$ or SBTN), bismuth titanate ($Bi_4Ti_3O_{12}$ or BIT), bismuth lanthanum titanate ($Bi_{3.25}La_{0.75}Ti_3O_{12}$ or BLT), barium strontium titanate ((Ba, Sr) $TiO_3$ or BST), or bismuth ferrite ($BiFeO_3$ or BFO).

For example, the ferroelectric capacitor 20 is formed in the following way. A layer of a material for the lower electrode 21 is formed over the substrate 10. A layer of a material for the ferroelectric film 23 is formed over the lower electrode 21. Furthermore, a layer of a material for the upper electrode 22 is formed over the ferroelectric film 23. After that, patterning is performed on these layers.

The lower electrode 21 and the upper electrode 22 of the ferroelectric capacitor 20 are connected to a conductor portion of a wiring layer formed in the substrate 10 and are connected in a way described later to a conductor portion of a wiring layer also formed over the substrate 10. The lower electrode 21 and the upper electrode 22 are connected via the conductor portions to semiconductor elements, such as transistors, in the substrate 10.

Figure 1B:
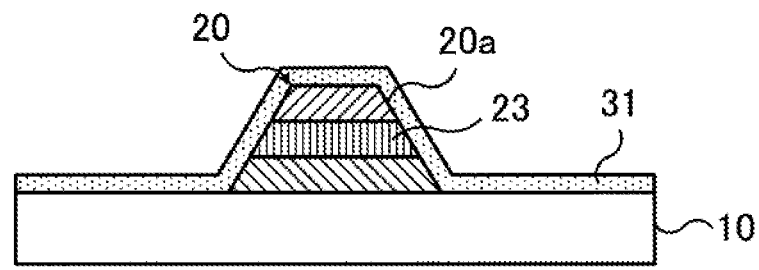

As illustrated in FIG. 1B, after the ferroelectric capacitor 20 is formed over the substrate 10, a first-layer insulating film 31 is formed over the substrate 10 so as to cover a surface 20a (top and sides) of the ferroelectric capacitor 20. The first-layer insulating film 31 is also referred to as a protection film.

The first-layer insulating film 31 formed so as to cover the surface 20a of the ferroelectric capacitor 20 has a barrier property against a determined element contained in the ferroelectric film 23 of the ferroelectric capacitor 20. For example, if the ferroelectric film 23 is formed by the use of a PZT-based material, then the first-layer insulating film 31 having a barrier property against metals, such as lead (Pb), zirconium (Zr), and titanium (Ti), which are constituent elements of the material is formed. The "barrier property" means the property of preventing a determined element, such as lead, contained in the ferroelectric film 23, even in the case of the evaporation of the determined element at the time of heat treatment in an oxidizing atmosphere described later, from passing through the first-layer insulating film 31 and preventing the determined element from exhaling or transpiring through the first-layer insulating film 31 to the outside.

The first-layer insulating film 31 formed so as to cover the surface 20*a* of the ferroelectric capacitor 20 has the above barrier property and has oxygen (O or $O_2$) permeability, hydrogen (H or $H_2$) permeability, and water ($H_2O$) permeability. The "permeability" means that oxygen, hydrogen, and water have the property of passing through the first-layer insulating film 31. As described later, for example, the "permeability" means that oxygen has the property of passing through the first-layer insulating film 31 from the outside to the inside or that hydrogen and water have the property of passing through the first-layer insulating film 31 from the inside to the outside.

The barrier property against the determined element and the oxygen permeability, the hydrogen permeability, and the water permeability of the first-layer insulating film 31 are adjusted by a material used for forming the first-layer insulating film 31, the thickness of the first-layer insulating film 31, or the like. For example, a metal oxide such as aluminum oxide (AlO or $Al_2O_3$), a metal nitride such as aluminum nitride (AlN), or a metal oxynitride such as aluminum oxynitride (AlON) is used for forming the first-layer insulating film 31. For example, the thickness of the first-layer insulating film 31 is set in the range of about several atomic layers to 20 nm.

The first-layer insulating film 31 is formed by a physical vapor deposition (PVD) method such as a sputtering method or a vacuum evaporation method, a chemical vapor deposition (CVD) method, an atomic layer deposition (ALD) method, or the like. If the CVD method or the ALD method is used, the surface 20*a* of the ferroelectric capacitor 20 is covered with the first-layer insulating film 31 with good coverage. If the first-layer insulating film 31 is formed by the CVD method or the ALD method, then a reducing substance, such as hydrogen or water, having the property of reducing the ferroelectric film 23 of the ferroelectric capacitor 20 may be contained in a material or a carrier (atmosphere at the time of forming the first-layer insulating film 31). If the first-layer insulating film 31 containing oxygen is formed by the CVD method or the ALD method, then an oxidizing substance, such as oxygen or ozone ($O_3$), may be contained in an atmosphere at the time of forming the first-layer insulating film 31. Furthermore, the first-layer insulating film 31 may be amorphous or part or all of the first-layer insulating film 31 may be crystalline.

Figure 1C:
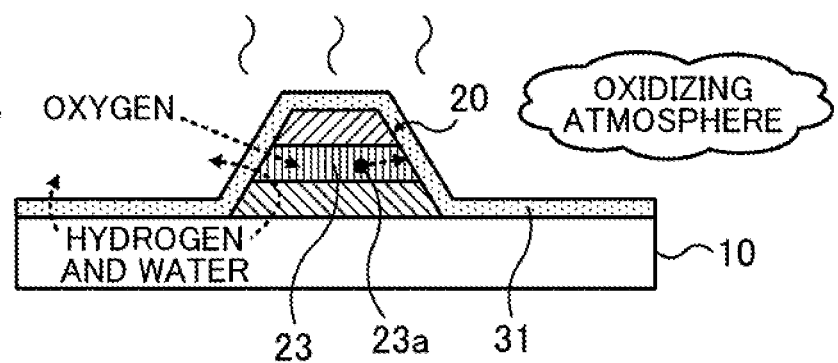

As illustrated in FIG. 1C, after the first-layer insulating film 31 is formed over the substrate 10 and the ferroelectric capacitor 20, heat treatment is performed in an oxidizing atmosphere. For example, heat treatment using oxygen is performed. By performing heat treatment in an oxidizing atmosphere, the ferroelectric film 23 of the ferroelectric capacitor 20 is crystallized, damage to the ferroelectric film 23 caused at formation time is recovered, and oxygen defects which reside in the ferroelectric film 23 are made up for. This heat treatment performed in an oxidizing atmosphere is also referred to as recovery anneal.

When the heat treatment is performed in the oxidizing atmosphere, a determined element 23*a*, such as lead, contained in the ferroelectric film 23 of the ferroelectric capacitor 20 may evaporate due to heat. The ferroelectric capacitor 20 is covered with the first-layer insulating film 31 having a barrier property against the determined element 23*a*. Accordingly, even if the determined element 23*a* evaporates, the transpiration of the determined element 23*a* to the outside of the first-layer insulating film 31 (into the atmosphere in which the heat treatment is performed) is suppressed. As a result, the formation of the vacancy of the determined element 23*a* (element defects) in the ferroelectric film 23 is suppressed and deterioration in the characteristics of the ferroelectric capacitor 20 caused by it is suppressed.

A dotted arrow in FIG. 1C schematically indicates that the transpiration of the determined element 23*a* in the ferroelectric film 23 into the atmosphere in which the heat treatment is performed is suppressed by the first-layer insulating film 31.

When the heat treatment is performed in the oxidizing atmosphere, oxygen outside the first-layer insulating film 31 which covers the ferroelectric capacitor 20 (in the atmosphere in which the heat treatment is performed) is supplied to the ferroelectric film 23 through the first-layer insulating film 31 having oxygen permeability. Because oxygen is supplied from the outside to the ferroelectric film 23 through the first-layer insulating film 31, the ferroelectric film 23 is oxidized, oxygen defects in the ferroelectric film 23 are made up for, and deterioration in the characteristics of the ferroelectric capacitor 20 caused by the oxygen defects is suppressed.

Furthermore, when the heat treatment is performed in the oxidizing atmosphere, hydrogen and water which reside in the substrate 10 and the ferroelectric capacitor 20 are discharged to the outside (into the atmosphere in which the heat treatment is performed) through the first-layer insulating film 31 having hydrogen permeability and water permeability. For example, hydrogen and water which reside in the substrate 10 reside in an interlayer insulating film of a wiring layer included in the substrate 10. For example, hydrogen and water which reside in the ferroelectric capacitor 20 include hydrogen and water which have diffused out from the substrate 10 and reached into the ferroelectric capacitor 20 and hydrogen and water contained in the atmosphere (in the material or the carrier) at the time of forming the first-layer insulating film 31 that have been adsorbed. When the heat treatment is performed in the oxidizing atmosphere, the above hydrogen and water are discharged to the outside through the first-layer insulating film 31.

If the ferroelectric film 23 of the ferroelectric capacitor 20 is reduced with hydrogen or water, then the polarization characteristic of the ferroelectric film 23 is degraded or lost. As a result, the characteristics of the ferroelectric capacitor 20 may deteriorate. However, the substrate 10 and the ferroelectric capacitor 20 are covered with the first-layer insulating film 31 having hydrogen permeability and water permeability. The hydrogen and water which reside in the substrate 10 and the ferroelectric capacitor 20 are discharged at heat treatment time to the outside through the first-layer insulating film 31. As a result, reduction of the ferroelectric film 23 with hydrogen or water is suppressed and deterioration in the characteristics of the ferroelectric capacitor 20 caused by it is suppressed. In addition, even if the ferroelectric film 23 is reduced with hydrogen or water which resides in the substrate 10 or the ferroelectric capacitor 20, the ferroelectric film 23 is oxidized at the heat treatment time with oxygen supplied from the outside through the first-layer insulating film 31. This also suppresses deterioration in the characteristics of the ferroelectric capacitor 20.

Dotted arrows in FIG. 1C schematically indicate that oxygen passes through the first-layer insulating film 31 from the outside to the inside and that hydrogen and water pass through the first-layer insulating film 31 from the inside to the outside.

Figure 1D:
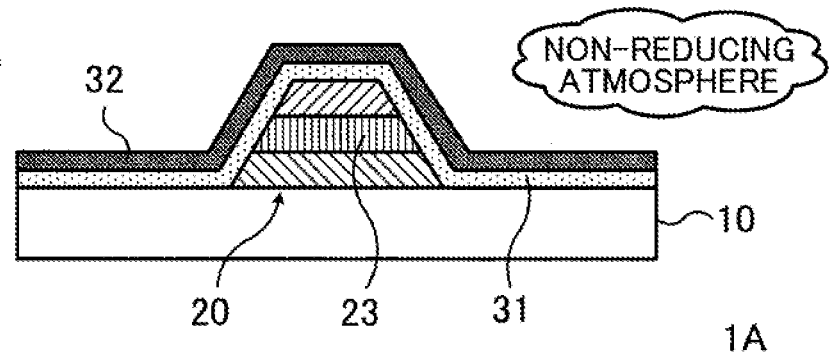

As illustrated in FIG. 1D, after the heat treatment is performed in the oxidizing atmosphere, a second-layer insulating film 32 is formed so as to cover the surface of the first-layer insulating film 31 formed over the substrate 10 and the ferroelectric capacitor 20. This second-layer insulating film 32 is also referred to as a protection film.

An insulating film having hydrogen permeability and water permeability lower than the hydrogen permeability and water permeability, respectively, of the first-layer insulating film 31 previously formed is used as the second-layer insulating film 32. That is to say, an insulating film through which hydrogen or water does not pass or through which it is difficult for hydrogen or water to pass is used as the second-layer insulating film 32. For example, the following methods are possible. A material having hydrogen permeability and water permeability lower than the hydrogen permeability and water permeability, respectively, of the first-layer insulating film 31 is used for forming the second-layer insulating film 32. The second-layer insulating film 32 is made thicker than the first-layer insulating film 31. The closeness (density) of the second-layer insulating film 32 is made higher than that of the first-layer insulating film 31. By doing so, adjustment is made so that hydrogen or water will not pass through the second-layer insulating film 32 or so that it will be difficult for hydrogen or water to pass through the second-layer insulating film 32. For example, a metal oxide such as aluminum oxide, a metal nitride such as aluminum nitride, or a metal oxynitride such as aluminum oxynitride is used for forming the second-layer insulating film 32. Furthermore, metal contained in a metal oxide, a metal nitride, or a metal oxynitride used for forming the second-layer insulating film 32 may be titanium, hafnium (Hf), zirconium, tantalum (Ta) or the like. In addition, a semimetal oxide such as silicon oxide (SiO or $SiO_2$), a semimetal nitride such as silicon nitride (SiN) or silicon carbonitride (SiCN), a semimetal oxynitride such as silicon oxynitride (SiON), or a semimetal carbide such as silicon carbide may be used for forming the second-layer insulating film 32. Moreover, a metal oxide or an alloy oxide containing lanthanoid may be used for forming the second-layer insulating film 32. For example, the thickness of the second-layer insulating film 32 is set in the range of about several atomic layers to 10 nm. Furthermore, the second-layer insulating film 32 may be amorphous or part or all of the second-layer insulating film 32 may be crystalline.

The second-layer insulating film 32 is formed in a non-reducing atmosphere not containing a reducing substance, such as hydrogen or water, having the property of reducing the ferroelectric film 23 of the ferroelectric capacitor 20. For example, the second-layer insulating film 32 is formed in such a non-reducing atmosphere by the use of the PVD method, such as the sputtering method or the vacuum evaporation method, or the CVD method.

As stated above, the first-layer insulating film 31 previously formed has relatively high hydrogen permeability and water permeability in order to discharge hydrogen and water in the substrate 10 and the ferroelectric capacitor 20 by the heat treatment. Accordingly, if a reducing substance, such as hydrogen or water, is contained in an atmosphere (in a material or a carrier) at the time of forming the second-layer insulating film 32, the reducing substance passes through the first-layer insulating film 31, enters the ferroelectric capacitor 20 or the substrate 10, and diffuses. As a result, the ferroelectric film 23 may be reduced. Furthermore, if metal or the like is contained in the first-layer insulating film 31, then the first-layer insulating film 31 may be reduced. As a result, the first-layer insulating film 31 may become conductive. Accordingly, a short circuit of the ferroelectric capacitor 20 may occur via the conductive film. However, if the second-layer insulating film 32 is formed in a non-reducing atmosphere not containing hydrogen or water, the entrance of hydrogen or water into the ferroelectric capacitor 20 and the like through the first-layer insulating film 31 or reduction of the ferroelectric film 23 caused by the entrance of hydrogen or water into the ferroelectric capacitor 20 and the like is suppressed. Because the second-layer insulating film 32 has relatively low hydrogen permeability and water permeability, the entrance of hydrogen or water from the outside to the inside of the second-layer insulating film 32 (to the side of the first-layer insulating film 31, the ferroelectric capacitor 20, or the substrate 10) is suppressed after the formation of the second-layer insulating film 32.

Furthermore, after the heat treatment is performed in the oxidizing atmosphere, the second-layer insulating film 32 may be formed by denaturing an outer layer portion of the first-layer insulating film 31 previously formed by treatment in a non-reducing atmosphere. This treatment (denaturation treatment) is performed in the non-reducing atmosphere so that the hydrogen permeability and water permeability of the second-layer insulating film 32 formed by denaturation will be lower than the hydrogen permeability and water permeability, respectively, of a portion corresponding to the first-layer insulating film 31 which remains after the denaturation, that is to say, so that hydrogen or water will not pass through the second-layer insulating film 32 formed by denaturation or so that it is difficult for hydrogen or water to pass through the second-layer insulating film 32 formed by denaturation. For example, the outer layer portion of the first-layer insulating film 31 is nitrided by heat treatment in an atmosphere containing nitrogen (N or $N_2$) and the nitrided outer layer portion is used as the second-layer insulating film 32. Alternatively, at least the outer layer portion of the first-layer insulating film 31 is made close by heat treatment in an atmosphere containing nitrogen (N or $N_2$) and the close outer layer portion is used as the second-layer insulating film 32. A structure in which the second-layer insulating film 32 is formed over the first-layer insulating film 31 (remaining portion after the denaturation treatment) may be obtained by the above denaturation treatment. Because the denaturation treatment is performed in the non-reducing atmosphere, the entrance of hydrogen or water into the ferroelectric capacitor 20 and the like through the first-layer insulating film 31 or reduction of the ferroelectric film 23 caused by the entrance of hydrogen or water into the ferroelectric capacitor 20 and the like is suppressed. The second-layer insulating film 32 formed in the outer layer portion of the first-layer insulating film 31 by the denaturation treatment has relatively low hydrogen permeability and water permeability. Accordingly, the entrance of hydrogen or water from the outside to the inside of the second-layer insulating film 32 is suppressed after the formation of the second-layer insulating film 32.

Figure 1E:
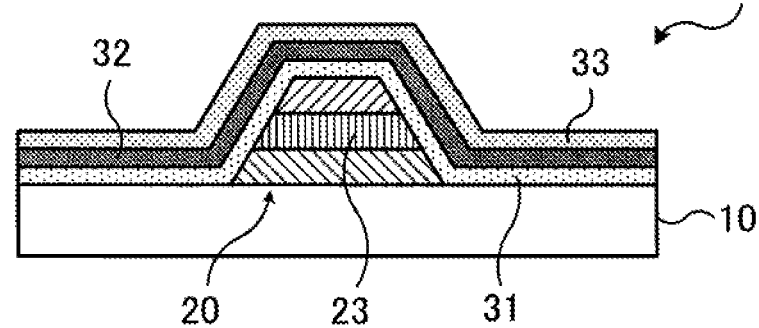

As illustrated in FIG. 1E, after the second-layer insulating film 32 is formed, a third-layer insulating film 33 is formed so as to cover the surface of the second-layer insulating film 32. This third-layer insulating film 33 is also referred to as a protection film.

The third-layer insulating film 33 is formed by the use of the CVD method, the ALD method, or the like. With the CVD method or the ALD method an insulating film having high coverage is apt to be formed, compared with the PVD method. Because the CVD method or the ALD method is used, the surface of the second-layer insulating film 32 is covered with the third-layer insulating film 33 with good coverage. If the third-layer insulating film 33 is formed by the use of the CVD method or the ALD method, a reducing substance, such as hydrogen or water, having the property of reducing the ferroelectric film 23 of the ferroelectric capacitor 20 may be contained in a material or a carrier (in an atmosphere at the time of forming the third-layer insulating film 33). However, the ferroelectric capacitor 20 is already covered with the second-layer insulating film 32 having relatively low hydrogen permeability and water permeability. Accordingly, reduction of the ferroelectric film 23 with hydrogen or water contained in the atmosphere at the time of forming the third-layer insulating film 33 is suppressed. If the third-layer insulating film 33 containing oxygen is formed by the use of the CVD method or the ALD method, an oxidizing substance, such as oxygen or ozone, may be contained in an atmosphere at the time of forming the third-layer insulating film 33.

For example, a second insulating film, such as an interlayer insulating film, is formed over the third-layer insulating film 33. In this case, the hydrogen permeability and water permeability of the third-layer insulating film 33 are made lower than the hydrogen permeability and water permeability, respectively, of the second insulating film formed over the third-layer insulating film 33. By doing so, the entrance of hydrogen or water which resides in the second insulating film into the inside of the third-layer insulating film 33 (to the side of the first-layer insulating film 31, the second-layer insulating film 32, the ferroelectric capacitor 20, or the substrate 10) is suppressed. The hydrogen permeability and water permeability of the third-layer insulating film 33 are adjusted by a material used for forming the third-layer insulating film 33, the thickness of the third-layer insulating film 33, or the like. For example, a metal oxide such as aluminum oxide or a semimetal nitride such as silicon nitride is used for forming the third-layer insulating film 33. For example, the thickness of the third-layer insulating film 33 is set in the range of about 10 to 50 nm.

For example, a semiconductor device 1A (FIG. 1E) including the substrate 10, the ferroelectric capacitor 20 formed over the substrate 10, and the three insulating films 31, 32, and 33 which cover the ferroelectric capacitor 20 is formed by the method illustrated in FIGS. 1A through 1E. The ferroelectric capacitor 20 formed over the substrate 10 is covered with the above three insulating films 31, 32, and 33. Accordingly, degradation of the ferroelectric film 23 under and after the formation of the semiconductor device 1A is suppressed and deterioration in the characteristics of the ferroelectric capacitor 20 is suppressed. As a result, a high performance and high-quality semiconductor device 1A with the ferroelectric capacitor 20 having excellent characteristics is realized.

FIGS. 2A through 2E are views for describing a second example of a method for forming the semiconductor device according to the first embodiment. Each of FIGS. 2A through 2E is a fragmentary sectional view schematically illustrative of a step of an example of a formation method of a semiconductor device having a ferroelectric capacitor.

Steps in the second example illustrated in FIGS. 2A through 2C are the same as the steps in the above first example illustrated in FIGS. 1A through 1C respectively. As illustrated in FIG. 2A, first a ferroelectric capacitor 20 including a lower electrode 21, an upper electrode 22, and a ferroelectric film 23 intervening therebetween is formed over a substrate 10. Next, as illustrated in FIG. 2B, a first-layer insulating film 31 is formed over the substrate 10 and the ferroelectric capacitor 20. The first-layer insulating film 31 has a barrier property against a determined element contained in the ferroelectric film 23 and has oxygen permeability, hydrogen permeability, and water permeability. Next, as illustrated in FIG. 2C, heat treatment is performed in an oxidizing atmosphere in order to crystallize the ferroelectric film 23, recover damage to the ferroelectric film 23 caused at formation time, and make up for oxygen defects which reside in the ferroelectric film 23 (recovery anneal).

In the second example, as illustrated in FIG. 2D, the first-layer insulating film 31 (FIG. 2C) formed over the substrate 10 and the ferroelectric capacitor 20 is denatured by treatment in a non-reducing atmosphere after the heat treatment in the oxidizing atmosphere. By doing so, an insulating film 31a is formed. This treatment (denaturation treatment) is performed in the non-reducing atmosphere so that the hydrogen permeability and water permeability of the insulating film 31a after the denaturation will be lower than the hydrogen permeability and water permeability, respectively, of the first-layer insulating film 31 before the denaturation that is to say, so that hydrogen or water will not pass through the insulating film 31a after the denaturation or so that it will be difficult for hydrogen and water to pass through the insulating film 31a after the denaturation. For example, the first-layer insulating film 31 is nitrided by heat treatment in an atmosphere containing nitrogen and the insulating film 31a denatured by nitriding is obtained. The insulating film 31a which covers a surface 20a of the ferroelectric capacitor 20 and which has low hydrogen permeability and water permeability is formed by this denaturation treatment. Because the denaturation treatment is performed in the non-reducing atmosphere, the entrance of hydrogen or water into the ferroelectric capacitor 20 and the like or reduction of the ferroelectric film 23 caused by the entrance of hydrogen or water into the ferroelectric capacitor 20 and the like is suppressed. The insulating film 31a has relatively low hydrogen permeability and water permeability. Accordingly, the entrance of hydrogen or water from the outside to the inside of the insulating film 31a is suppressed after the formation of the insulating film 31a.

As illustrated in FIG. 2E, after the insulating film 31a is formed, a second-layer insulating film 33 which covers the surface of the insulating film 31a is formed in this second example. This is the same with the above FIG. 1E. For example, the hydrogen permeability and water permeability of the second-layer insulating film 33 are made lower than the hydrogen permeability and water permeability, respectively, of a second insulating film, such as an interlayer insulating film, formed over the second-layer insulating film 33. By doing so, the entrance of hydrogen or water which resides in the second insulating film into the inside of the second-layer insulating film 33 is suppressed.

For example, a semiconductor device 1B (FIG. 2E) including the substrate 10, the ferroelectric capacitor 20 formed over the substrate 10, and the two insulating films 31a and 33 which cover the ferroelectric capacitor 20 is formed by the method illustrated in FIGS. 2A through 2E. The ferroelectric capacitor 20 formed over the substrate 10 is covered with the above two insulating films 31a and 33. Accordingly, degradation of the ferroelectric film 23 under and after the formation of the semiconductor device 1B is suppressed and deterioration in the characteristics of the ferroelectric capacitor 20 is suppressed. As a result, a high performance and high-quality semiconductor device 1B with the ferroelectric capacitor 20 having excellent characteristics is realized.

Second Embodiment

A first example of a semiconductor device in which the structure described in the above first embodiment is adopted will now be described as a second embodiment.

Figure 3:
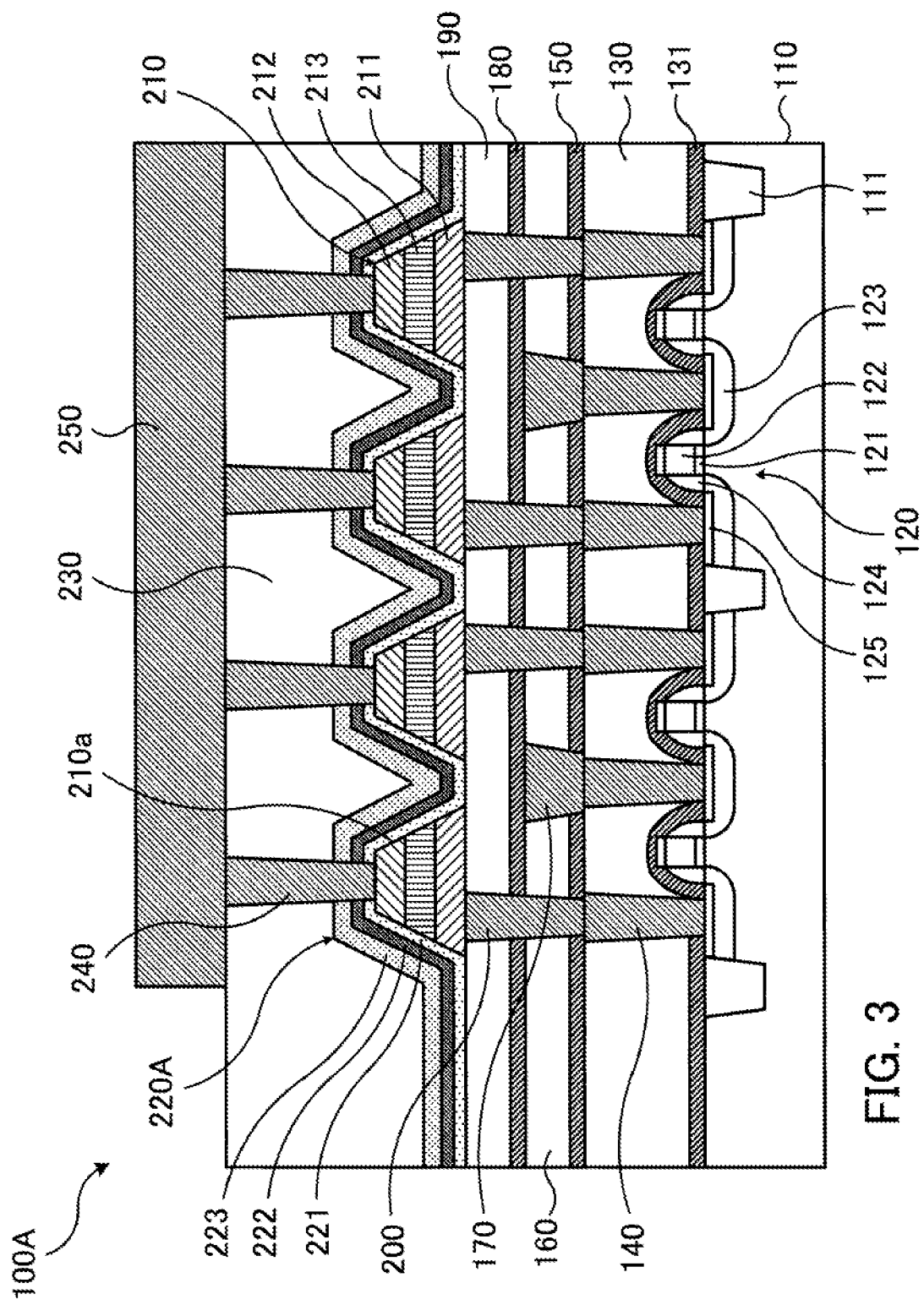
FIG. 3 is a view for describing an example of a semiconductor device according to a second embodiment.

FIG. 3 is a view for describing an example of a semiconductor device according to a second embodiment. FIG. 3 is a fragmentary schematic sectional view of an example of a semiconductor device.

A semiconductor device 100A illustrated in FIG. 3 includes a semiconductor substrate 110 and a transistor 120 formed over the semiconductor substrate 110. A structure portion including a cover film 131, an interlayer insulating film 130, a plug 140, and an etching stopper film 150 is formed over the semiconductor substrate 110 over which the transistor 120 is formed. Furthermore, another structure portion including an interlayer insulating film 160, a wiring 170, an anti-oxidation film 180, a buffer film 190, a plug 200, a ferroelectric capacitor 210, a protection film 220A, an interlayer insulating film 230, a plug 240, and a wiring 250 is formed over the above structure portion.

For example, a silicon substrate of a determined conduction type is used as the semiconductor substrate 110. An isolation region 111 is formed in the semiconductor substrate 110, for example, by the use of a shallow trench isolation (STI) technique. The transistor 120 is formed in an element region demarcated by the isolation region 111.

The transistor 120 includes a gate electrode 122 formed over the semiconductor substrate 110 with a gate insulating film 121 therebetween, impurity regions 123 of a determined conduction type formed in the semiconductor substrate 110 on both sides of the gate electrode 122, and a side wall 124 formed on the sidewalls of the gate electrode 122. Each impurity region 123 functions as a source or a drain of the transistor 120. A silicide layer 125 is formed in outer layer portions of the impurity regions 123 and an outer layer portion of the gate electrode 122. An impurity region (not illustrated), such as a well, of a determined conduction type may be formed in the element region of the semiconductor substrate 110 in which the transistor 120 is formed.

The interlayer insulating film 130 is formed over the semiconductor substrate 110 so as to cover the transistor 120. For example, silicon oxide is used for forming the interlayer insulating film 130. The interlayer insulating film 130 may have a single-layer structure or a laminated structure including two or more layers. The cover film 131 which covers the transistor 120 is formed between the interlayer insulating film 130 and the semiconductor substrate 110. The cover film 131 is made of silicon nitride or the like.

The plug 140 is formed so that it will pierce the interlayer insulating film 130 and the cover film 131 and so that it will be connected to the transistor 120. The plug 140 is connected to the impurity region 123 which functions as the source or the drain of the transistor 120. Titanium, titanium nitride (TiN), tungsten (W), or the like is used for forming the plug 140. Not only the plug 140 connected to the impurity region 123 of the transistor 120 but also a similar plug (not illustrated) connected to the gate electrode 122 of the transistor 120 is included in the semiconductor device 100A.

The etching stopper film 150 is formed over the interlayer insulating film 130. For example, silicon nitride is used for forming the etching stopper film 150.

The interlayer insulating film 160 is formed over the etching stopper film 150. For example, silicon oxide is used for forming the interlayer insulating film 160. The interlayer insulating film 160 may have a single-layer structure or a laminated structure including two or more layers.

The wiring 170 is formed so that it will pierce the interlayer insulating film 160 and the etching stopper film 150 and so that it will be connected to the plug 140. Titanium, titanium nitride, tungsten, or the like is used for forming the wiring 170. The wiring 170 functions as a bit line. Not only the wiring 170 which functions as a bit line but also a similar wiring (not illustrated) connected to the gate electrode 122 of the transistor 120 (plug connected to the gate electrode 122 of the transistor 120) is included in the semiconductor device 100A.

The anti-oxidation film 180 is formed over the interlayer insulating film 160 and the wiring 170. The anti-oxidation film 180 has the function of preventing the wiring 170 (and the wiring connected to the gate electrode 122) from being oxidized at the time of, for example, oxidation treatment performed in the process of forming the semiconductor device 100A. For example, silicon nitride is used for forming the anti-oxidation film 180. The anti-oxidation film 180 has not only the function of preventing the wiring 170 from being oxidized but also a function as a film (also referred to as a barrier film, a block film, or the like) which cuts off hydrogen and water.

The buffer film 190 is formed over the anti-oxidation film 180. For example, silicon oxide is used for forming the buffer film 190. The buffer film 190 may have a single-layer structure or a laminated structure including two or more layers.

The plugs 200 are formed so that they will pierce the buffer film 190, the anti-oxidation film 180, the interlayer insulating film 160, and the etching stopper film 150 and so that they will be connected to part of the plugs 140 (plugs 140 other than plugs 140 to which the wirings 170 are connected). Titanium, titanium nitride, tungsten, or the like is used for forming the plugs 200.

The ferroelectric capacitor 210 is formed in a region over the buffer film 190 corresponding to the plug 200. The ferroelectric capacitor 210 includes a lower electrode 211, an upper electrode 212, and a ferroelectric film 213 intervening therebetween. The lower electrode 211 is formed so that it will be connected to the plug 200. The ferroelectric film 213 is formed over the lower electrode 211. The upper electrode 212 is formed over the ferroelectric film 213. A material, such as iridium or iridium oxide, is used for forming the lower electrode 211 and the upper electrode 212. A ferroelectric material, such as PZT, is used for forming the ferroelectric film 213.

The ferroelectric capacitor 210 is a component corresponding to the ferroelectric capacitor 20 described in the first example in the above first embodiment. A structure (semiconductor substrate 110, the transistor 120, the cover film 131, the interlayer insulating film 130, the plug 140, the etching stopper film 150, the interlayer insulating film 160, the wiring 170, the anti-oxidation film 180, the buffer film 190, and the plug 200) formed under the ferroelectric capacitor 210 is a component corresponding to the substrate 10 described in the first example in the above first embodiment.

The protection film 220A is formed over the buffer film 190 over whose top the ferroelectric capacitor 210 is formed so as to cover the top of the buffer film 190 and the top and sides (surface 210a) of the ferroelectric capacitor 210. The protection film 220A has a three-layer structure in which an insulating film 221, an insulating film 222, and an insulating film 223 are laminated.

The first-layer insulating film 221 of the protection film 220A covers the ferroelectric capacitor 210, has a barrier property against a determined element contained in the ferroelectric film 213, and has oxygen permeability, hydrogen permeability, and water permeability. The barrier property against the determined element and the oxygen permeability, hydrogen permeability, and water permeability of the first-layer insulating film 221 are adjusted by a material used for forming the first-layer insulating film 221, the thickness of the first-layer insulating film 221, or the like. For example, a metal oxide such as aluminum oxide, a metal nitride such as aluminum nitride, or a metal oxynitride such as aluminum oxynitride is used for forming the first-layer insulating film 221. For example, the thickness of the first-layer insulating film 221 is set in the range of about several atomic layers to 20 nm.

The first-layer insulating film 221 of the protection film 220A is a component corresponding to the first-layer insulating film 31 described in the first example in the above first embodiment.

The second-layer insulating film 222 of the protection film 220A covers the first-layer insulating film 221 and has hydrogen permeability and water permeability lower than the hydrogen permeability and water permeability, respectively, of the first-layer insulating film 221. The hydrogen permeability and water permeability of the second-layer insulating film 222 are adjusted by a material used for forming the second-layer insulating film 222, the thickness of the second-layer insulating film 222, or the like. For example, a metal oxide such as aluminum oxide, a metal nitride such as aluminum nitride, or a metal oxynitride such as aluminum oxynitride is used for forming the second-layer insulating film 222. Furthermore, metal contained in a metal oxide, a metal nitride, or a metal oxynitride used for forming the second-layer insulating film 222 may be titanium, hafnium, zirconium, tantalum or the like. In addition, a semimetal oxide such as silicon oxide, a semimetal nitride such as silicon nitride or silicon carbonitride, a semimetal oxynitride such as silicon oxynitride, or a semimetal carbide such as silicon carbide may be used for forming the second-layer insulating film 222. Moreover, a metal oxide or an alloy oxide containing lanthanoid may be used for forming the second-layer insulating film 222. For example, the thickness of the second-layer insulating film 222 is set in the range of about several atomic layers to 10 nm.

The second-layer insulating film 222 of the protection film 220A is a component corresponding to the second-layer insulating film 32 described in the first example in the above first embodiment.

The third-layer insulating film 223 of the protection film 220A covers the second-layer insulating film 222 and has hydrogen permeability and water permeability lower than the hydrogen permeability and water permeability, respectively, of the interlayer insulating film 230 formed over the protection film 220A. The hydrogen permeability and water permeability of the third-layer insulating film 223 are adjusted by a material used for forming the third-layer insulating film 223, the thickness of the third-layer insulating film 223, or the like. For example, a metal oxide such as aluminum oxide or a semimetal nitride such as silicon nitride is used for forming the third-layer insulating film 223. For example, the thickness of the third-layer insulating film 223 is set in the range of about 10 to 50 nm.

The third-layer insulating film 223 of the protection film 220A is a component corresponding to the third-layer insulating film 33 described in the first example in the above first embodiment.

The interlayer insulating film 230 is formed over the protection film 220A. For example, silicon oxide is used for forming the interlayer insulating film 230. The interlayer insulating film 230 may have a single-layer structure or a laminated structure including two or more layers.

The plug 240 is formed so as to pierce the interlayer insulating film 230 and the protection film 220A. The plug 240 pierces the interlayer insulating film 230 and the protection film 220A and is connected to the ferroelectric capacitor 210 (upper electrode 212 of the ferroelectric capacitor 210). Titanium, titanium nitride, tungsten, or the like is used for forming the plug 240. Not only the plug 240 connected to the ferroelectric capacitor 210 but also a similar plug (not illustrated) which pierces the interlayer insulating film 230, the protection film 220A, the buffer film 190, and the anti-oxidation film 180 and which is connected to the gate electrode 122 of the transistor 120 (plug and a wiring connected to the gate electrode 122 of the transistor 120) is included in the semiconductor device 100A.

The wiring 250 is formed over the interlayer insulating film 230 so that it will be connected to the plug 240. For example, what is called an aluminum wiring is used as the wiring 250. The wiring 250 is formed by the use of titanium, titanium nitride, or an aluminum-copper alloy (AlCu). The wiring 250 connected to the ferroelectric capacitor 210 functions as a plate line. Not only the wiring 250 which functions as a plate line but also a similar wiring (not illustrated) which is connected to the gate electrode 122 of the transistor 120 (plug or a plug and a wiring connected to the gate electrode 122 of the transistor 120) and which functions as a word line is included in the semiconductor device 100A.

For example, the semiconductor device 100A is a ferroelectric random access memory (FeRAM) in which the ferroelectric capacitor 210 is used as a memory element (cell). FIG. 3 is a fragmentary schematic sectional view of the semiconductor device 100A. In addition to the ferroelectric capacitor 210, the semiconductor device 100A includes a sense amplifier, a row decoder, a control circuit, and a peripheral circuit (not illustrated) which control the ferroelectric capacitor 210. The ferroelectric capacitor 210 is connected via the bit line and the word line to the sense amplifier and the row decoder respectively. With the semiconductor device 100A a stack structure is adopted. That is to say, the ferroelectric capacitor 210 is disposed above the bit line and is located over the plug 200 which pierces the buffer film 190.

With the semiconductor device 100A the ferroelectric capacitor 210 is covered with the protection film 220A including the above three insulating films 221, 222, and 223. Because the protection film 220A is used in the semiconductor device 100A, degradation of the ferroelectric film 213 under and after the formation of the semiconductor device 100A is suppressed and deterioration in the characteristics of the ferroelectric capacitor 210 is suppressed.

A method for forming the semiconductor device 100A will now be described.

Figure 4:
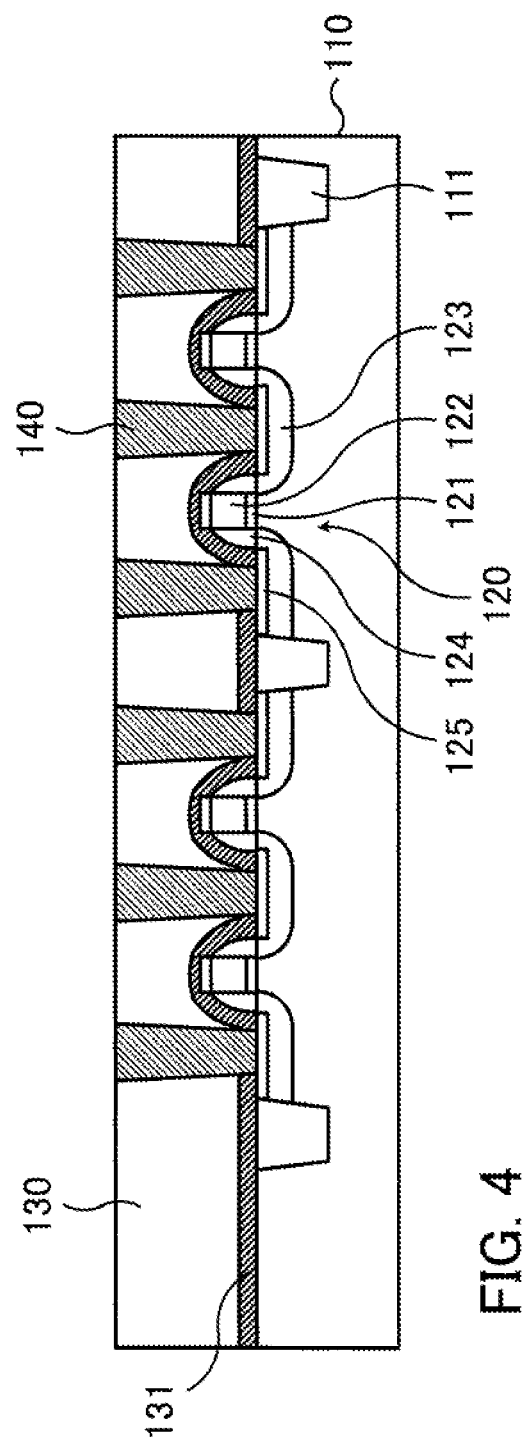
FIG. 4 is a view for describing a first formation step of the semiconductor device according to the second embodiment.

FIG. 4 is a view for describing a first formation step of the semiconductor device according to the second embodiment. FIG. 4 is a fragmentary schematic sectional view of an example of a formation step of the semiconductor device.

In a step illustrated in FIG. 4, first a silicon substrate of a determined conduction type is prepared as the semiconductor substrate 110. For example, a p-type silicon substrate is prepared as the semiconductor substrate 110. The isolation region 111 is formed in the semiconductor substrate 110 by the use of the STI technique. After that, ion implantation may be performed for forming a well, a channel stop diffusion layer, and the like (not illustrated)

Next, silicon oxide is formed over the surface of the semiconductor substrate 110 by the use of a thermal oxidation method. Polycrystalline silicon is formed over the silicon oxide by the use of the CVD method. Furthermore, patterning is performed on the formed polycrystalline silicon and silicon oxide by the use of a photolithography technique and an etching technique. As a result, the gate insulating film 121 made of the silicon oxide and the gate electrode 122 made of the polycrystalline silicon are formed over the semiconductor substrate 110. After that, impurity ions of a determined conduction type may be injected. For example, n-type impurity ions may be injected to form a lightly doped drain (LDD) region which becomes part of the impurity region 123.

Next, an insulator, such as silicon oxide, is deposited by the use of the CVD method so as to cover the gate electrode 122 and the gate insulating film 121. The insulator is etched back to form the side wall 124 which covers the sides of the gate electrode 122 and the gate insulating film 121.

Next, the gate electrode 122 and the side wall 124 are used as a mask and impurity ions of a determined conduction type are injected. For example, n-type impurity ions are injected to form the source and the drain. After that, activation is performed by heat treatment and the n-type impurity region 123 is formed.

Next, a salicide process is used. That is to say, the silicide layer 125 is formed in the outer layer portions of the gate electrode 122 and the impurity regions 123 in order to reduce contact resistance.

As a result, the transistor 120 is formed over the semiconductor substrate 110.

After the transistor 120 is formed, an insulator, such as silicon nitride, is deposited by the use of the CVD method so as to cover the transistor 120. By doing so, the cover film 131 is formed. For example, the cover film 131 having a thickness of about 70 nm is formed.

Next, an insulator, such as silicon oxide, is deposited over the cover film 131 by the use of the CVD method. The surface of the insulator is planarized by the use of a chemical mechanical polishing (CMP) method. By doing so, the interlayer insulating film 130 is formed.

Next, a contact hole which pierces the interlayer insulating film 130 and the cover film 131 and which reaches the impurity region 123 of the transistor 120 is formed by the use of the photolithography technique and the etching technique. Not only the contact hole which reaches the impurity region 123 of the transistor 120 but also a contact hole (not illustrated) which reaches the gate electrode 122 of the transistor 120 is formed.

Next, a titanium film and a titanium nitride film which function as an adhesion layer are formed in order on the sides and bottom of the formed contact hole. The contact hole in which the titanium film and the titanium nitride film are formed is filled up with tungsten. Furthermore, an excess titanium film, an excess titanium nitride film, and excess tungsten deposited over the interlayer insulating film 130 are removed by the use of the CMP method. By doing so, the plug 140 (and plug connected to the gate electrode 122) are formed.

As a result, the structure illustrated in FIG. 4 is formed.

Figure 5:
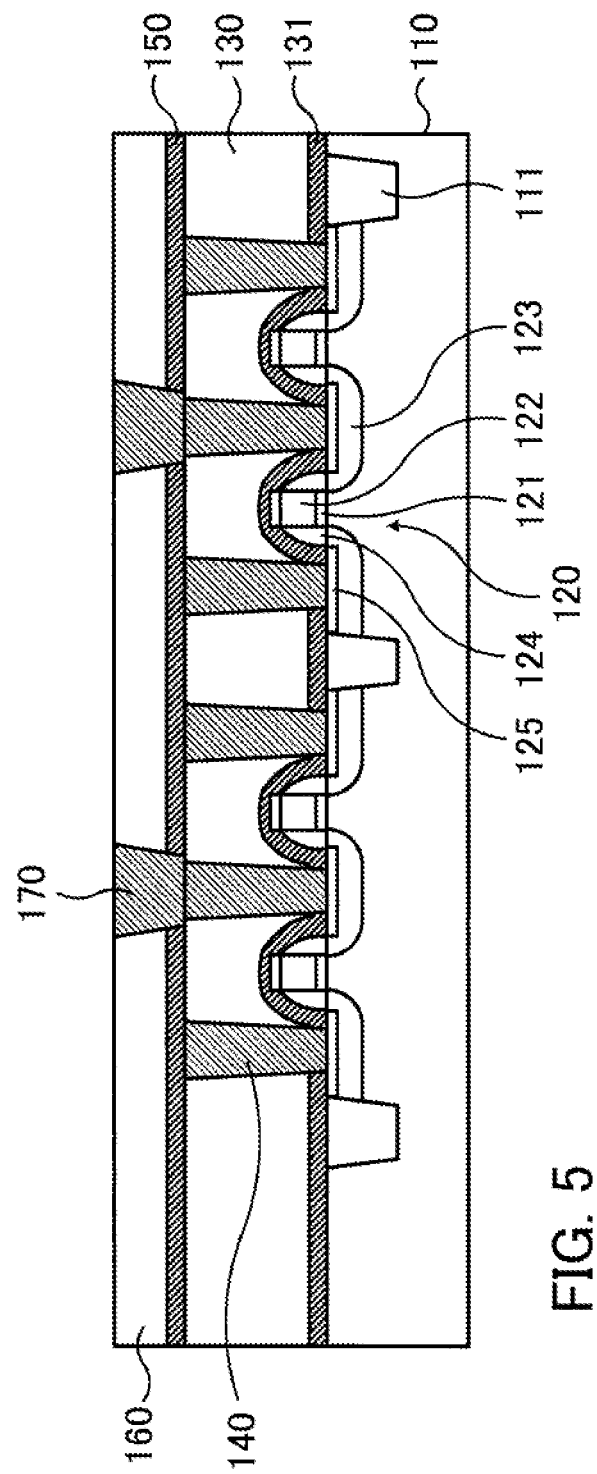
FIG. 5 is a view for describing a second formation step of the semiconductor device according to the second embodiment.

FIG. 5 is a view for describing a second formation step of the semiconductor device according to the second embodiment. FIG. 5 is a fragmentary schematic sectional view of an example of a formation step of the semiconductor device.

In a step illustrated in FIG. 5, an insulator, such as silicon nitride, is deposited over the interlayer insulating film 130, the plug 140, and the like by the use of the CVD method after the formation of the above plug 140 and the like. By doing so, the etching stopper film 150 is formed. For example, the etching stopper film 150 having a thickness of about 40 nm is formed.

Next, an insulator, such as silicon oxide, is deposited over the etching stopper film 150 by the use of the CVD method. By doing so, the interlayer insulating film 160 is formed.

Next, a groove that pierces regions of the interlayer insulating film 160 and the etching stopper film 150 in which the wiring 170 is to be formed and that reaches the plug 140 connected to the wiring 170 is formed by the use of the photolithography technique and the etching technique.

Next, a titanium film and a titanium nitride film which function as an adhesion layer are formed in order on the sides and bottom of the formed groove. The groove in which the titanium film and the titanium nitride film are formed is filled up with tungsten. Furthermore, an excess titanium film, an excess titanium nitride film, and excess tungsten deposited over the interlayer insulating film 160 are removed by the use of the CMP method. By doing so, the wiring 170 which functions as a bit line is formed. Not only the wiring 170 which functions as a bit line but also another wiring (wiring connected to a plug connected to the gate electrode 122, for example) (not illustrated) is formed.

As a result, the structure illustrated in FIG. 5 is formed.

Figure 6:
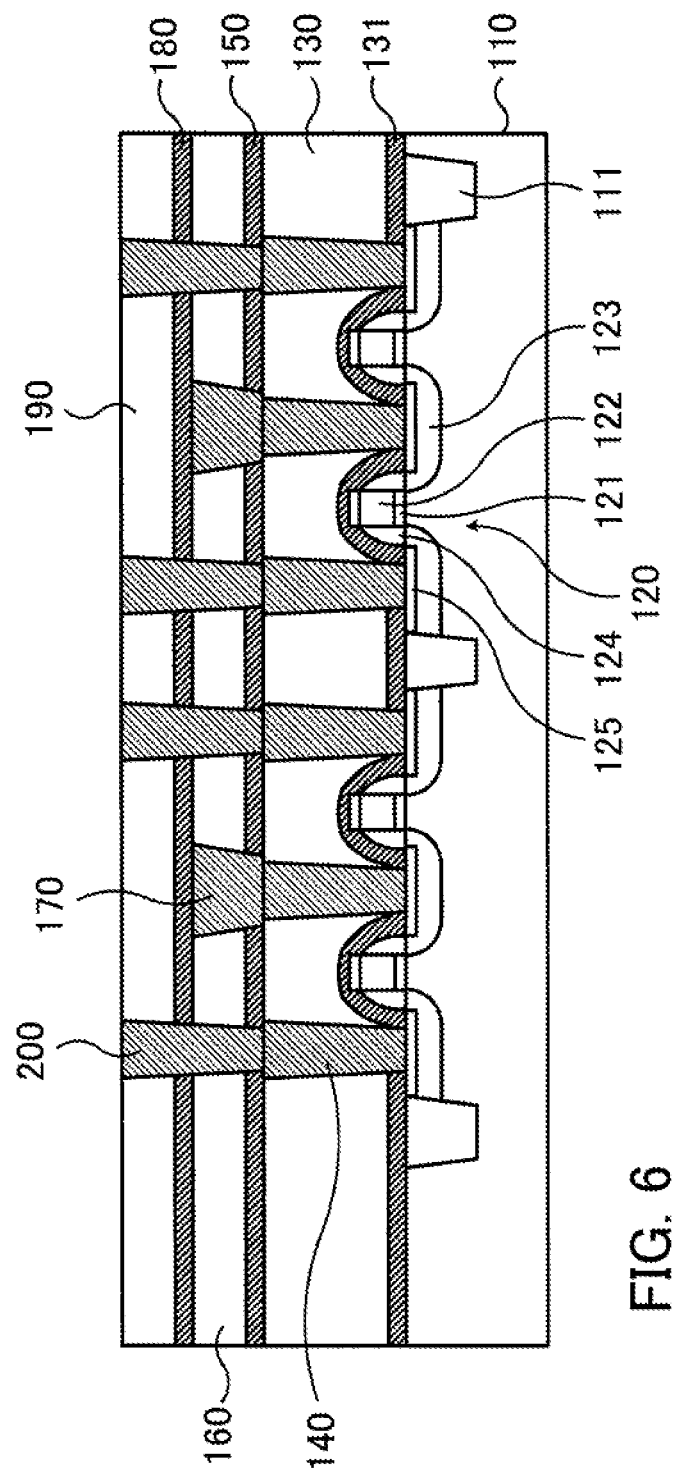
FIG. 6 is a view for describing a third formation step of the semiconductor device according to the second embodiment.

FIG. 6 is a view for describing a third formation step of the semiconductor device according to the second embodiment. FIG. 6 is a fragmentary schematic sectional view of an example of a formation step of the semiconductor device.

In a step illustrated in FIG. 6, an insulator, such as silicon nitride, is deposited over the interlayer insulating film 160, the wiring 170, and the like by the use of the CVD method after the formation of the above wiring 170 and the like. By doing so, the anti-oxidation film 180 is formed. For example, the anti-oxidation film 180 having a thickness of about 100 nm is formed.

Next, an insulator, such as silicon oxide, is deposited over the anti-oxidation film 180 by the use of the CVD method. By doing so, the buffer film 190 is formed. For example, the buffer film 190 having a thickness of about 230 nm is formed.

Next, a contact hole which pierces the buffer film 190, the anti-oxidation film 180, the interlayer insulating film 160, and the etching stopper film 150 and which reaches the plug 140 is formed by the use of the photolithography technique and the etching technique.

Next, a titanium film and a titanium nitride film which function as an adhesion layer are formed in order on the sides and bottom of the formed contact hole. The contact hole in which the titanium film and the titanium nitride film are formed is filled up with tungsten. Furthermore, an excess titanium film, an excess titanium nitride film, and excess tungsten deposited over the buffer film 190 are removed by the use of the CMP method. By doing so, the plug 200 is formed. The plug 200 is connected via the plug 140 to the impurity region 123 of the transistor 120.

As a result, the structure illustrated in FIG. 6 is formed.

Figure 7:
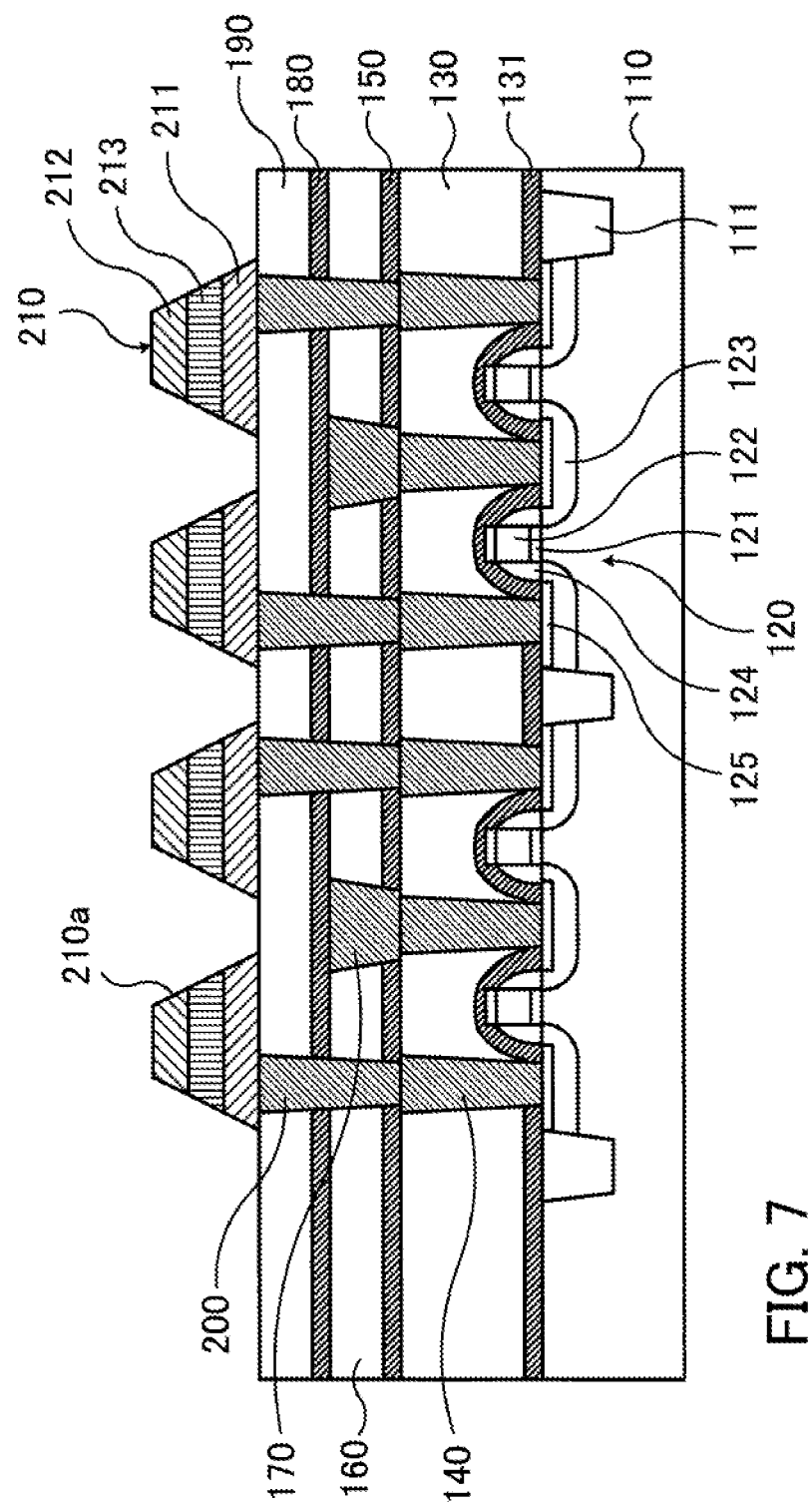
FIG. 7 is a view for describing a fourth formation step of the semiconductor device according to the second embodiment (part 1)

FIG. 7 and FIGS. 8A through 8D are views for describing a fourth formation step of the semiconductor device according to the second embodiment. FIG. 7 is a fragmentary schematic sectional view of an example of a formation step of the semiconductor device. FIGS. 8A through 8D are fragmentary schematic sectional views of an example of a formation step of the ferroelectric capacitor.

In a step illustrated in FIG. 7, the ferroelectric capacitor 210 is formed in a region over the plug 200 in the buffer film 190 after the formation of the above plug 200. The ferroelectric capacitor 210 has the lower electrode 211, the ferroelectric film 213, and the upper electrode 212. The lower electrode 211 is formed over the plug 200, the ferroelectric film 213 is formed over the lower electrode 211, and the upper electrode 212 is formed over the ferroelectric film 213.

Figure 8A:
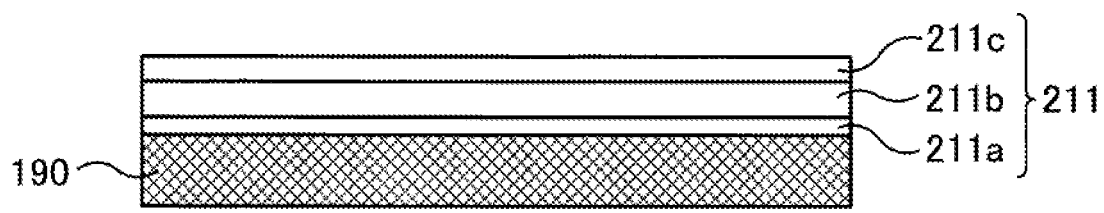
FIGS. 8A through 8D are views for describing the fourth formation step of the semiconductor device according to the second embodiment (part 2)

The ferroelectric capacitor 210 is formed in the following way. As illustrated in FIG. 8A, for example, first a titanium nitride film 211a is formed over the buffer film 190. Furthermore, an aluminum titanium nitride (TiAlN) film 211b is formed over the titanium nitride film 211a. The titanium nitride film 211a functions as an adhesion layer. The aluminum titanium nitride film 211b functions as an anti-oxidation electrode which prevents oxidation of the plug 200 and the plug 140 caused by crystallization treatment of the ferroelectric film 213 described later. Next, an iridium film 211c is formed over the formed aluminum titanium nitride film 211b. The lower electrode 211 (before patterning) is formed by the titanium nitride film 211a, the aluminum titanium nitride film 211b, and the iridium film 211c.

Figure 8B:
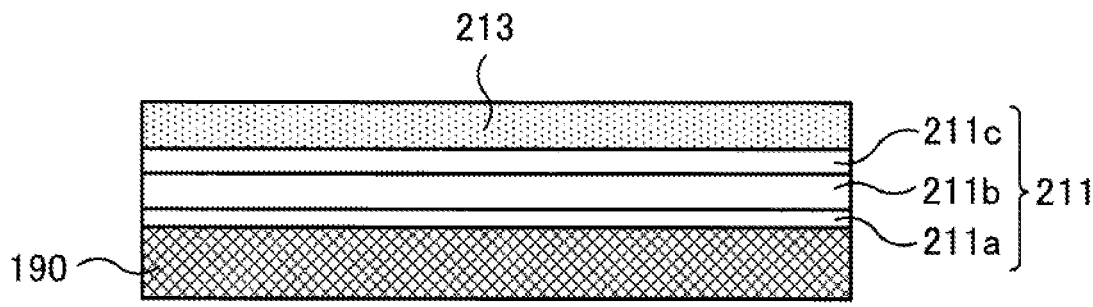

Next, as illustrated in FIG. 8B, the ferroelectric film 213, such as PZT, is formed over the lower electrode 211. After that, rapid heating treatment, such as heat treatment using oxygen (oxidation treatment), is performed on the formed ferroelectric film 213. As a result, desorption of an excess element from the ferroelectric film 213 and oxidation of the ferroelectric film 213 occur. Accordingly, the crystallized ferroelectric film 213 (before patterning) is formed.

Figure 8C:
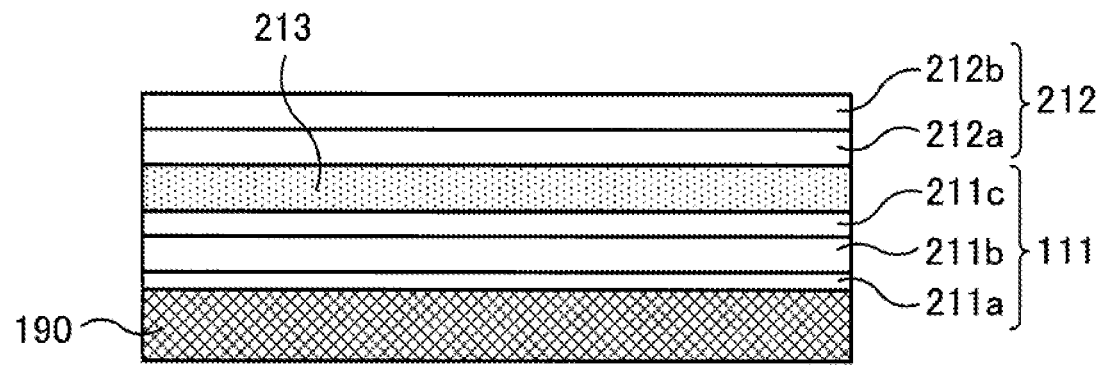

Next, as illustrated in FIG. 8C, an iridium oxide film 212a, for example, is formed over the ferroelectric film 213. Furthermore, an iridium film 212b is formed over the iridium oxide film 212a. The upper electrode 212 (before patterning) is formed by the iridium oxide film 212a and the iridium film 212b. Heat treatment, such as heat treatment using oxygen (oxidation treatment), may be performed before, after, or before and after the formation of the upper electrode 212 in order to improve the ferroelectricity of the ferroelectric film 213.

Figure 8D:
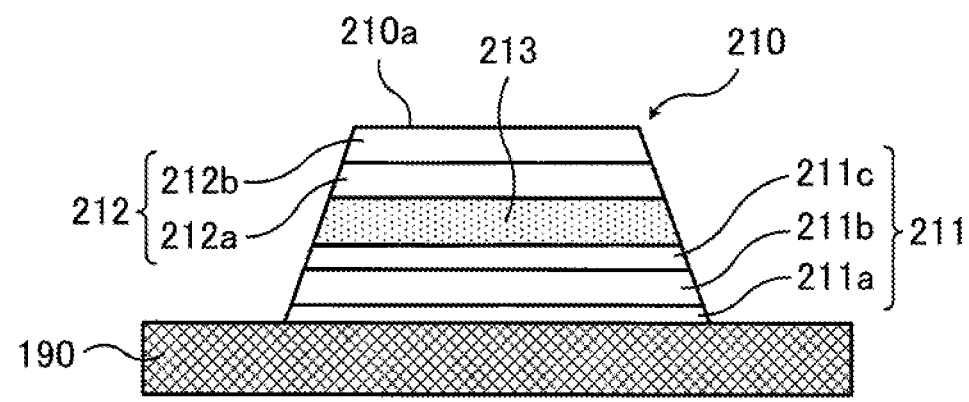

Next, as illustrated in FIG. 8D, patterning is performed on the formed upper electrode 212, ferroelectric film 213, and lower electrode 211 by the use of the photolithography technique and the etching technique. By doing so, the ferroelectric capacitor 210 is formed.

As a result, the structure of FIG. 7 in which the ferroelectric capacitor 210 (FIG. 7 and FIGS. 8A through 8D) is formed over the substrate is formed.

Figure 9:
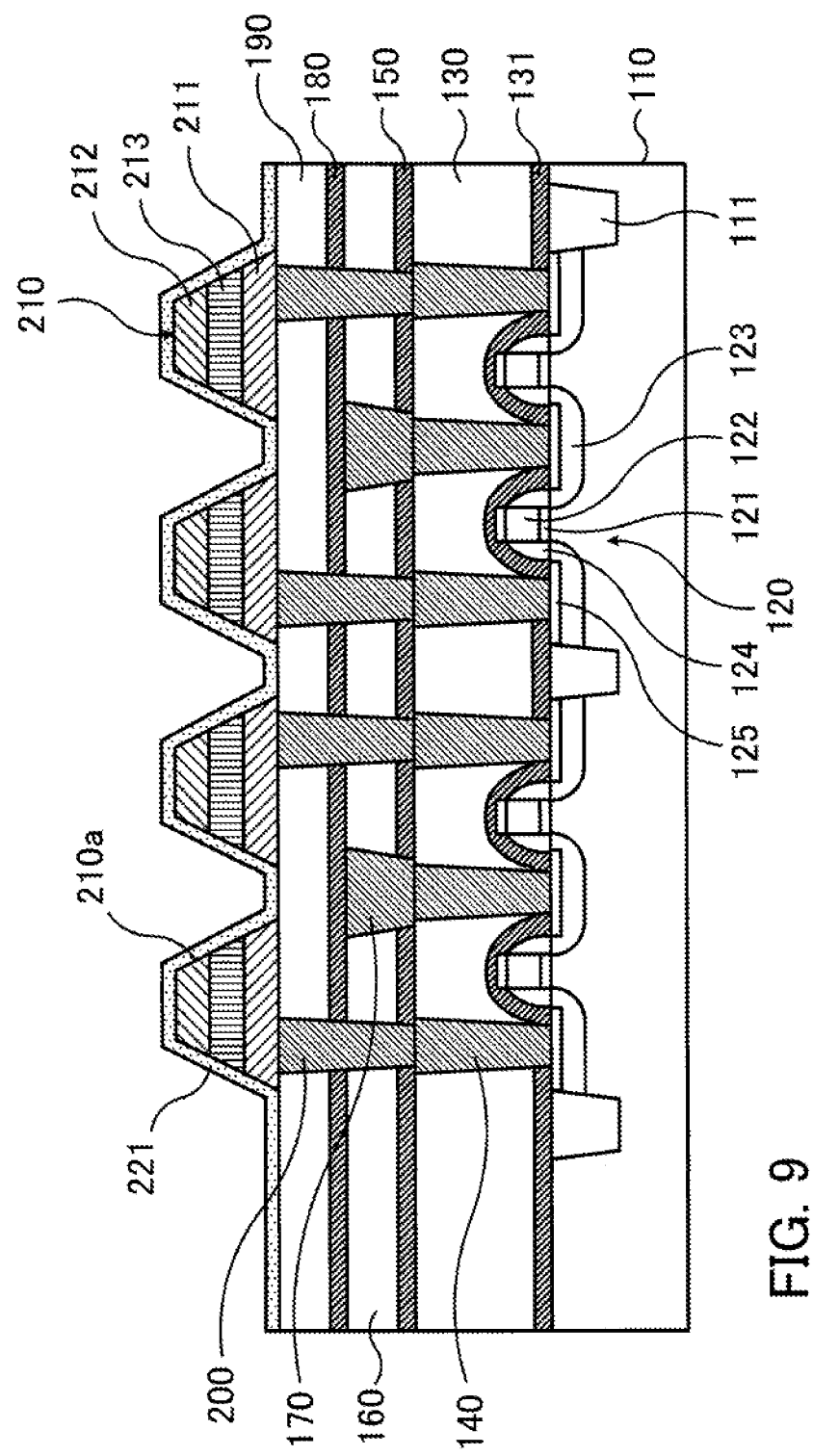
FIG. 9 is a view for describing a fifth formation step of the semiconductor device according to the second embodiment.

FIG. 9 is a view for describing a fifth formation step of the semiconductor device according to the second embodiment. FIG. 9 is a fragmentary schematic sectional view of an example of a formation step of the semiconductor device.

In a step illustrated in FIG. 9, the above determined insulating material is deposited to the determined thickness over the buffer film 190 and the ferroelectric capacitor 210 so as to cover the surface 210a of the ferroelectric capacitor 210. As a result, the first-layer insulating film 221 which is part of the protection film 220A is formed. An insulating material used for forming the first-layer insulating film 221 and the thickness of the first-layer insulating film 221 are adjusted so that the first-layer insulating film 221 will have a barrier property against a determined element contained in the ferroelectric film 213 and so that the first-layer insulating film 221 will have oxygen permeability, hydrogen permeability, and water permeability. For example, aluminum oxide is used for forming the first-layer insulating film 221 having a thickness of about several atomic layers to 20 nm. The first-layer insulating film 221 is formed by the use of the PVD method, the CVD method, the ALD method, or the like. For example, the first-layer insulating film 221 is formed by the use of the sputtering method which is a kind of the PVD method.

As a result, the structure illustrated in FIG. 9 is obtained.

Figure 10:
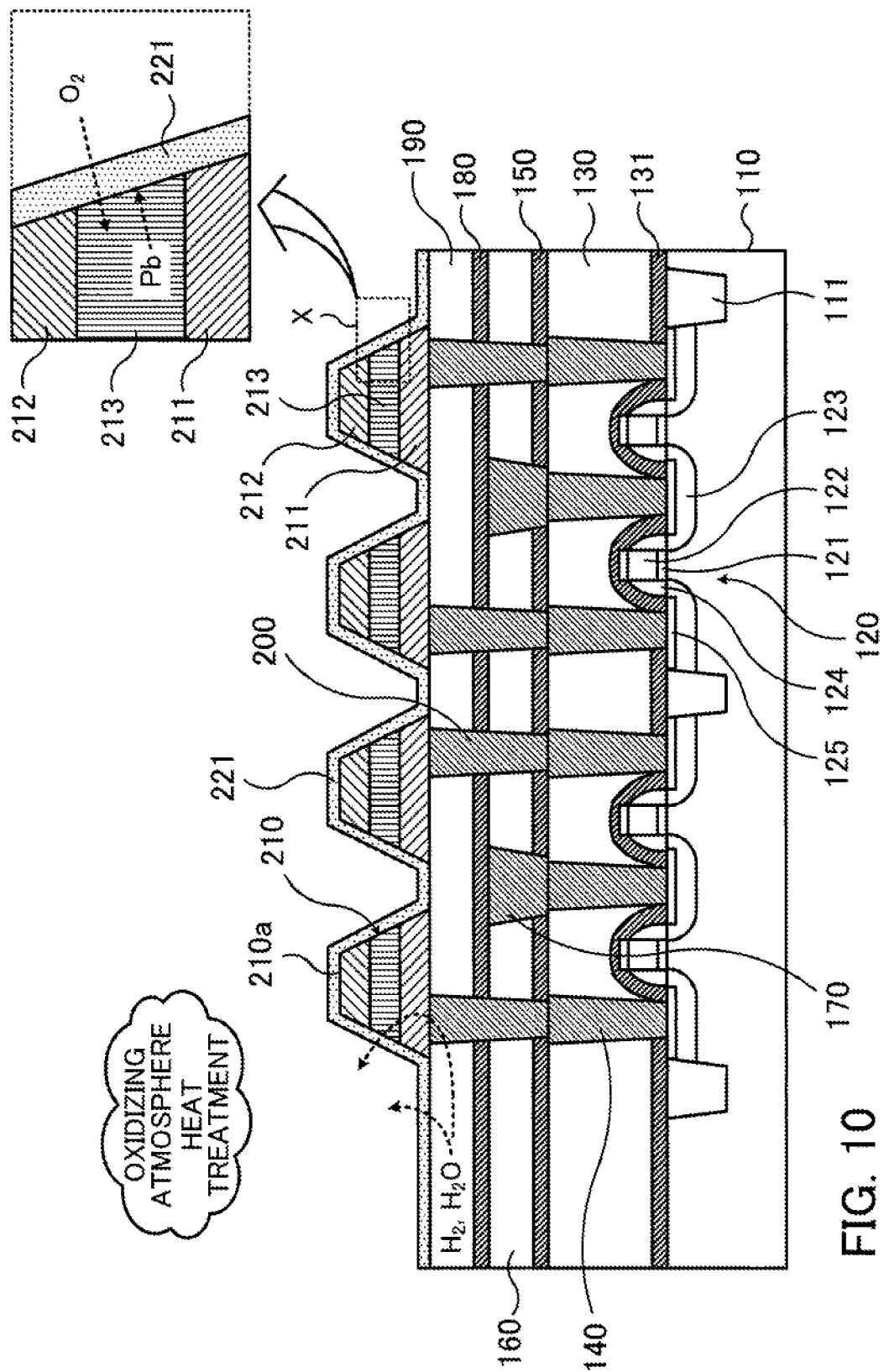
FIG. 10 is a view for describing a sixth formation step of the semiconductor device according to the second embodiment (part 1)
Figure 11A:
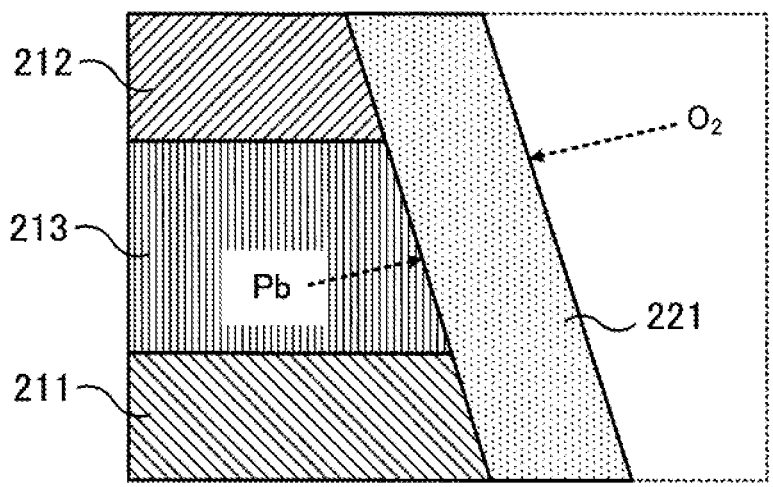
FIGS. 11A and 11B are views for describing the sixth formation step of the semiconductor device according to the second embodiment (part 2)
Figure 11B:
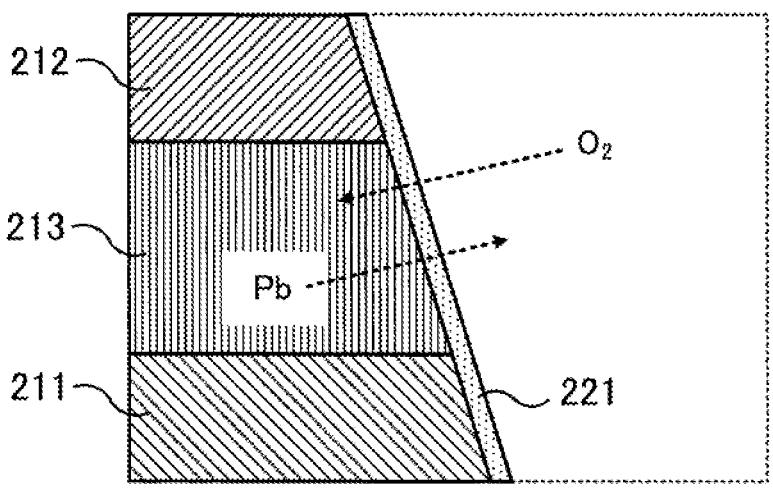
Figure 12:
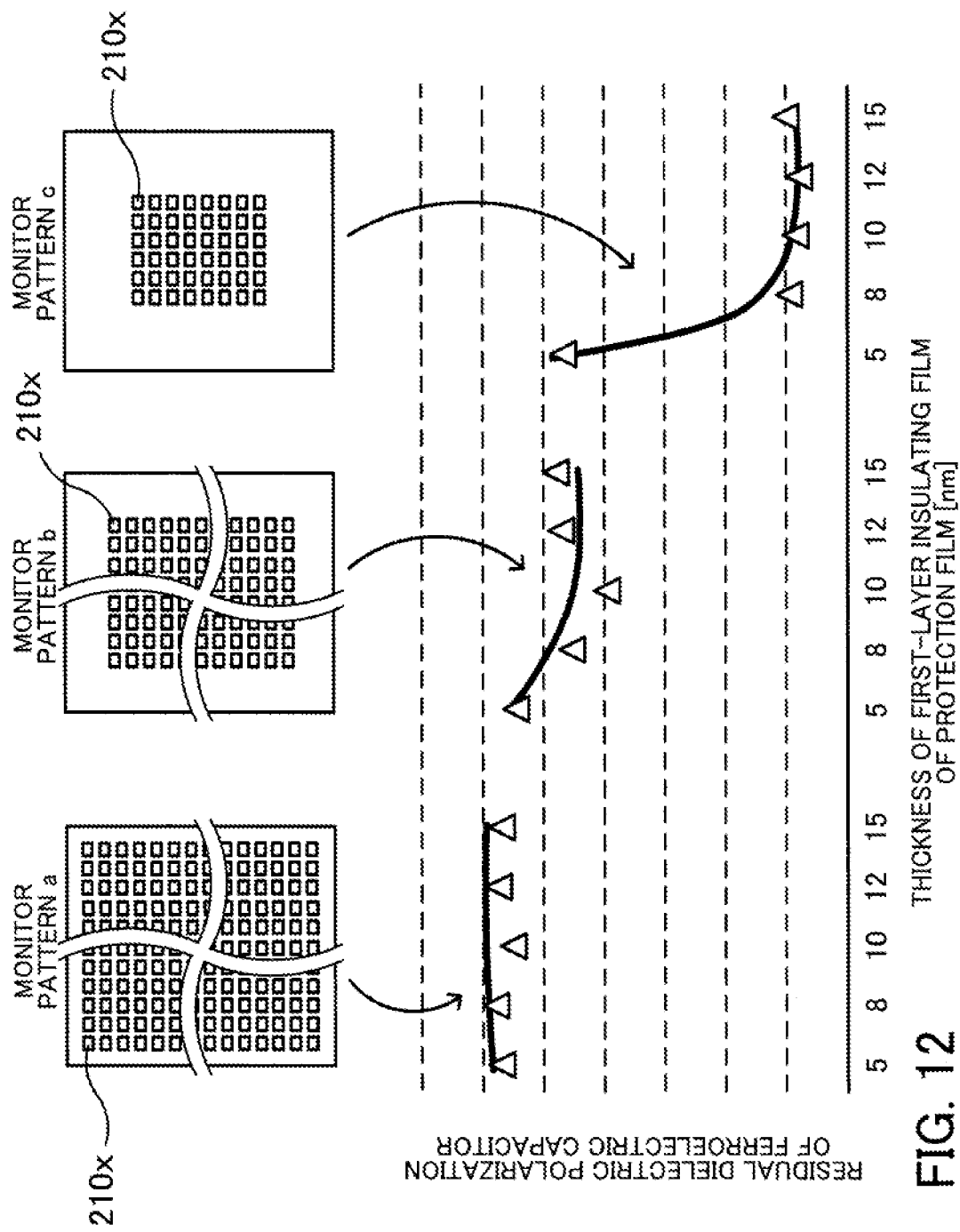
FIG. 12 is a view for describing the sixth formation step of the semiconductor device according to the second embodiment (part 3)

FIGS. 10 through 12 are views for describing a sixth formation step of the semiconductor device according to the second embodiment. FIG. 10 is a fragmentary schematic sectional view of an example of a formation step of the semiconductor device. FIG. 10 also illustrates an enlarged X portion. FIGS. 11A and 11B illustrate comparative examples corresponding to the X portion of FIG. 10. FIG. 12 illustrates an example of a result obtained by evaluating monitor patterns which differ in array arrangement of ferroelectric capacitors for the relationship between the thickness of the first-layer insulating film of the protection film and residual dielectric polarization of a ferroelectric capacitor.

In a step illustrated in FIG. 10, heat treatment (recovery anneal) is performed in an oxidizing atmosphere after the formation of the above first-layer insulating film 221. For example, a heat treatment furnace is used and heat treatment is performed in an atmosphere containing oxygen for 30 to 90 minutes at a temperature of 500 to 700° C.

When the heat treatment is performed in the oxidizing atmosphere, a determined element contained in the ferroelectric film 213 of the ferroelectric capacitor 210 may evaporate. For example, lead, zirconium, titanium, or the like (lead is illustrated in FIG. 10 and FIGS. 11A and 11B described later) contained in PZT may evaporate. Even in such a case, transpiration of the determined element into the atmosphere outside the first-layer insulating film 221 in which the heat treatment is performed is suppressed by covering the ferroelectric capacitor 210 with the first-layer insulating film 221 having a barrier property against the determined element. As a result, the formation of the vacancy of the determined element in the ferroelectric film 213 is suppressed and deterioration in the characteristics of the ferroelectric capacitor 210 caused by it is suppressed.

In FIG. 10 (and FIG. 11A described later), a dotted arrow in enlarged portions of the ferroelectric capacitor 210 and the first-layer insulating film 221 schematically indicates that transpiration of the determined element (lead) in the ferroelectric film 213 into the atmosphere in which the heat treatment is performed is suppressed by the first-layer insulating film 221.

When the heat treatment is performed in the oxidizing atmosphere, oxygen resides in the atmosphere in which the heat treatment is performed. This oxygen outside the first-layer insulating film 221 which covers the ferroelectric capacitor 210 is supplied to the ferroelectric film 213 through the first-layer insulating film 221 having oxygen permeability. Because oxygen is supplied from the outside to the ferroelectric film 213 through the first-layer insulating film 221, the ferroelectric film 213 is oxidized, oxygen defects in the ferroelectric film 213 are made up for, and deterioration in the characteristics of the ferroelectric capacitor 210 caused by the oxygen defects is suppressed.

In FIG. 10 (and FIG. 11B described later), a dotted arrow schematically indicates that oxygen passes through the first-layer insulating film 221 from the outside to the inside.

The first-layer insulating film 221 of the protection film 220A which covers the ferroelectric capacitor 210 has a barrier property against the determined element contained in the ferroelectric film 213 and has permeability to oxygen contained in the atmosphere in which the heat treatment is performed. The barrier property and oxygen permeability of the first-layer insulating film 221 will now be described further with reference to FIG. 10 and FIGS. 11A and 11B.

As illustrated in the enlarged portions of FIG. 10, a material used for forming the first-layer insulating film 221 and the thickness of the first-layer insulating film 221 are adjusted so that when the heat treatment is performed in the oxidizing atmosphere, transpiration of the determined element, such as lead (Pb), contained in the ferroelectric film 213 into the atmosphere will be suppressed and so that when the heat treatment is performed in the oxidizing atmosphere, oxygen (0Q) contained in the atmosphere will be supplied to the ferroelectric film 213.

If the first-layer insulating film 221 is too thick, then the following situation may occur. That is to say, as illustrated in FIG. 11A, lead contained in the ferroelectric film 213 does not pass through the first-layer insulating film 221. Accordingly, transpiration of lead into the atmosphere in which the heat treatment is performed is suppressed. However, oxygen contained in the atmosphere in which the heat treatment is performed does not pass through the first-layer insulating film 221, either. As a result, there is a possibility that oxygen is not supplied to the ferroelectric film 213. On the other hand, if the first-layer insulating film 221 is too thin, then the following situation may occur. That is to say, as illustrated in FIG. 11B, oxygen contained in the atmosphere in which the heat treatment is performed passes through the first-layer insulating film 221. Accordingly, oxygen is supplied to the ferroelectric film 213. However, lead contained in the ferroelectric film 213 also passes through the first-layer insulating film 221. As a result, transpiration of lead into the atmosphere in which the heat treatment is performed may occur. From these standpoints, the thickness of the first-layer insulating film 221 is adjusted according to an insulating material used for forming the first-layer insulating film 221 so that transpiration of lead contained in the ferroelectric film 213 into the atmosphere in which the heat treatment is performed will be suppressed and so that oxygen contained in the atmosphere in which the heat treatment is performed will be supplied to the ferroelectric film 213.

The first-layer insulating film 221 of the protection film 220A which covers the ferroelectric capacitor 210 has permeability to hydrogen and water contained in the atmosphere in which the heat treatment is performed. Next, the hydrogen permeability and water permeability of the first-layer insulating film 221 will be described further with reference to FIG. 10 and FIG. 12.

As illustrated in FIG. 10, when the heat treatment is performed in the oxidizing atmosphere, hydrogen (H₂) or water (H₂O) which resides in the ferroelectric capacitor 210 and the structure under the ferroelectric capacitor 210 is discharged to the outside (into the atmosphere in which the heat treatment is performed) through the first-layer insulating film 221 having hydrogen permeability and water permeability.

For example, hydrogen or water which resides in the buffer film 190 of silicon oxide or the like under the ferroelectric capacitor 210 is discharged into the atmosphere through the first-layer insulating film 221. Furthermore, hydrogen or water which diffuses from the buffer film 190 into the ferroelectric capacitor 210 or hydrogen or water which is contained in an atmosphere (in a material or a carrier) at the time of forming the first-layer insulating film 221 and which adsorbs on the ferroelectric capacitor 210 is discharged into the atmosphere through the first-layer insulating film 221. Because the buffer film 190 and the ferroelectric capacitor 210 are covered with the first-layer insulating film 221 having hydrogen permeability and water permeability, hydrogen or water which resides in the buffer film 190 and the ferroelectric capacitor 210 is discharged through the first-layer insulating film 221 into the atmosphere in which the heat treatment is performed. As a result, reduction of the ferroelectric film 213 with hydrogen or water is suppressed and deterioration in the characteristics of the ferroelectric capacitor 210 caused by it is suppressed. In addition, even if the ferroelectric film 213 is reduced with hydrogen or water, the ferroelectric film 213 is oxidized with oxygen supplied through the first-layer insulating film 221. This also suppresses deterioration in the characteristics of the ferroelectric capacitor 210.

In FIG. 10, a dotted arrow schematically indicates that hydrogen or water passes through the first-layer insulating film 221 from the inside to the outside.

If the first-layer insulating film 221 is too thick, then hydrogen or water which resides in the buffer film 190 and the ferroelectric capacitor 210 is not discharged through the first-layer insulating film 221 into the atmosphere in which the heat treatment is performed. As a result, the ferroelectric film 213 goes into what is called a smothered state and degradation of the ferroelectric film 213 progresses. As the volume of interlayer insulating films around the ferroelectric capacitor 210, that is to say, the volume of the buffer film 190 under the ferroelectric capacitor 210 and the interlayer insulating film 230 over the ferroelectric capacitor 210 increases, such progress of degradation of the ferroelectric film 213 tends to become more significant. With a cell array in which a plurality of ferroelectric capacitors 210 are arranged in vertical and horizontal directions in planar view, for example, the volume of interlayer insulating films around a ferroelectric capacitor 210 in an end portion of the cell array is relatively large. The characteristics of such a ferroelectric capacitor 210 tend to deteriorate.

FIG. 12 illustrates a result obtained by using a special monitor pattern which reproduces the state of a ferroelectric capacitor near an end portion of a cell array and measuring residual dielectric polarization of the ferroelectric capacitor.

In the example of FIG. 12, three monitor patterns a, b, and c are used. The monitor pattern a has a structure in which 84 ferroelectric capacitors 210x and 257 ferroelectric capacitors 210x are arranged in horizontal and vertical directions, respectively, in planar view. The monitor pattern b has a structure in which 84 ferroelectric capacitors 210x and 32 ferroelectric capacitors 210x are arranged in horizontal and vertical directions, respectively, in planar view. The monitor pattern c has a structure in which 6 ferroelectric capacitors 210x and 8 ferroelectric capacitors 210x are arranged in horizontal and vertical directions, respectively, in planar view. Each of the monitor patterns a, b, and c is prepared in the following way. A determined number of ferroelectric capacitors 210x are formed over an interlayer insulating film made of silicon oxide. The ferroelectric capacitors 210x and the interlayer insulating film are covered with a first-layer insulating film made of aluminum oxide, heat treatment is performed in an oxidizing atmosphere, and the first-layer insulating film is covered with a second-layer insulating film made of aluminum oxide. With the monitor pattern a, the volume of the interlayer insulating film around a ferroelectric capacitor 210x near an end portion of the cell array is the smallest. With the monitor pattern c, the volume of the interlayer insulating film around a ferroelectric capacitor 210x near an end portion of the cell array is the largest. With the monitor pattern b, the volume of the interlayer insulating film around a ferroelectric capacitor 210x near an end portion of the cell array is intermediate between the volume of the interlayer insulating film with the monitor pattern a and the volume of the interlayer insulating film with the monitor pattern c. The monitor pattern c in which the volume of the interlayer insulating film around the ferroelectric capacitor 210x near the end portion of the cell array is the largest has a structure which is most apt to be influenced by hydrogen or water in the interlayer insulating film.

With the monitor pattern a, the volume of the interlayer insulating film around the ferroelectric capacitor 210x near the end portion of the cell array is the smallest. FIG. 12 indicates that with the monitor pattern a, an increase in the thickness of the first-layer insulating film of the protection film which covers the ferroelectric capacitor 210x hardly causes a change in the residual dielectric polarization. The volume of the interlayer insulating film around the ferroelectric capacitor 210x near the end portion of the cell array becomes larger in the order of the monitor pattern b and the monitor pattern c. As the volume of the interlayer insulating film around the ferroelectric capacitor 210x near the end portion of the cell array increases, deterioration in the residual dielectric polarization becomes more significant with an increase in the thickness of the first-layer insulating film of the protection film which covers the ferroelectric capacitor 210x. With the monitor pattern b or the monitor pattern c, as the thickness of the first-layer insulating film of the protection film which covers the ferroelectric capacitor 210x decreases, deterioration in the residual dielectric polarization tends to become smaller. This means the following. If the thickness of the first-layer insulating film of the protection film which covers the ferroelectric capacitor 210x is larger than or equal to a certain thickness, then hydrogen or water in the interlayer insulating film around the ferroelectric capacitor 210x is not efficiently discharged into the atmosphere. As a result, the ferroelectric capacitor 210x goes into a smothered state and the degradation progresses.

This proves that the thickness of the first-layer insulating film 221 of the protection film 220A which covers the ferroelectric capacitor 210 is important in the semiconductor device 100A. As can be seen from FIG. 12, if the thickness of the first-layer insulating film 221 is smaller than or equal to 10 nm, then deterioration in the characteristics of the ferroelectric capacitor 210 is suppressed regardless of the volume of the interlayer insulating films around the ferroelectric capacitor 210.

Figure 13:
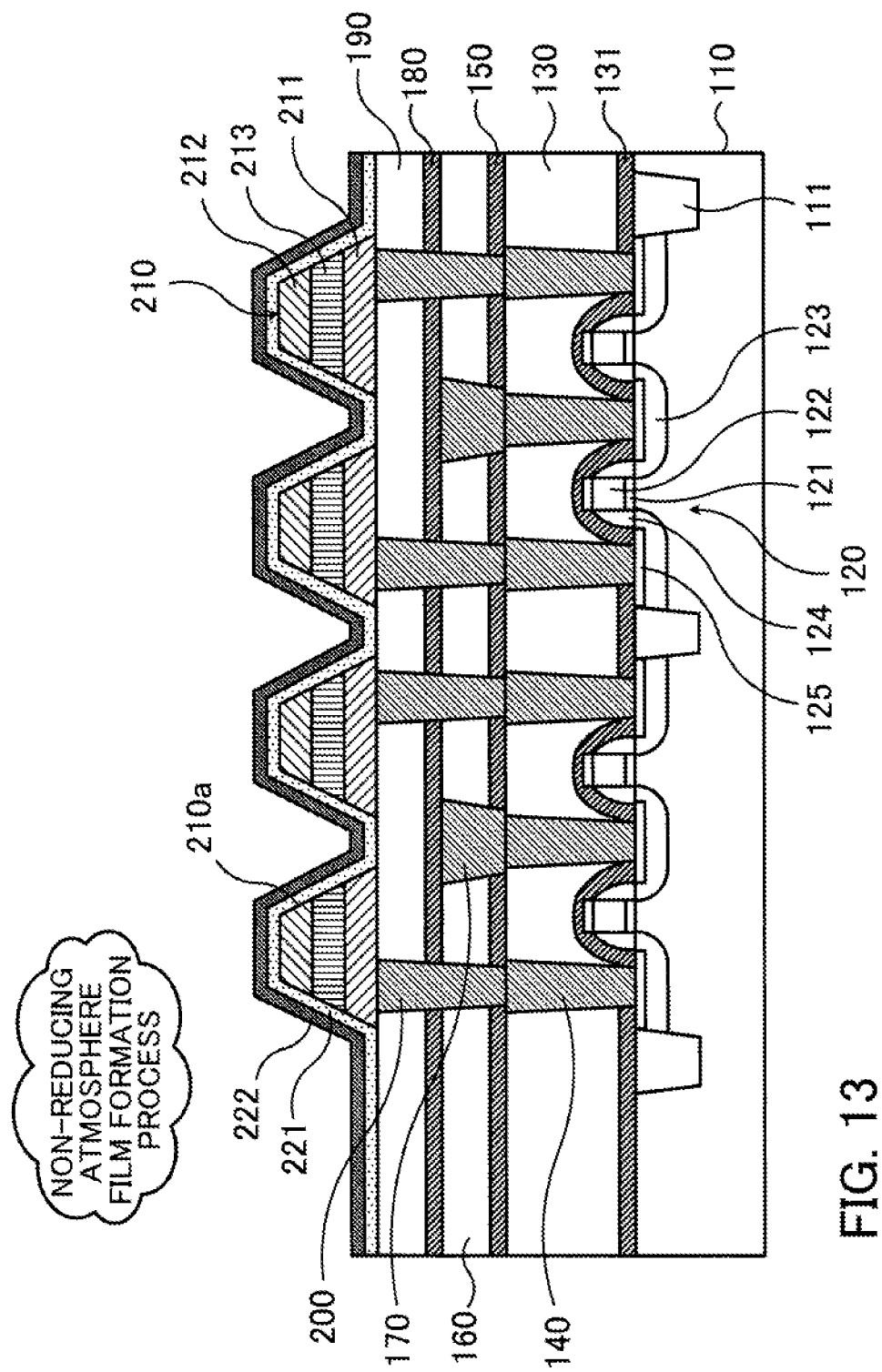
FIG. 13 is a view for describing a seventh formation step of the semiconductor device according to the second embodiment (part 1)
Figure 14A:
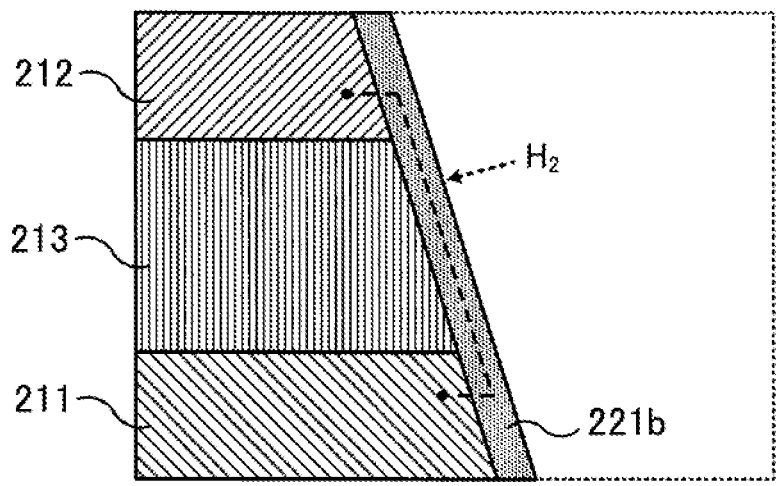
FIGS. 14A and 14B are views for describing the seventh formation step of the semiconductor device according to the second embodiment (part 2)
Figure 14B:
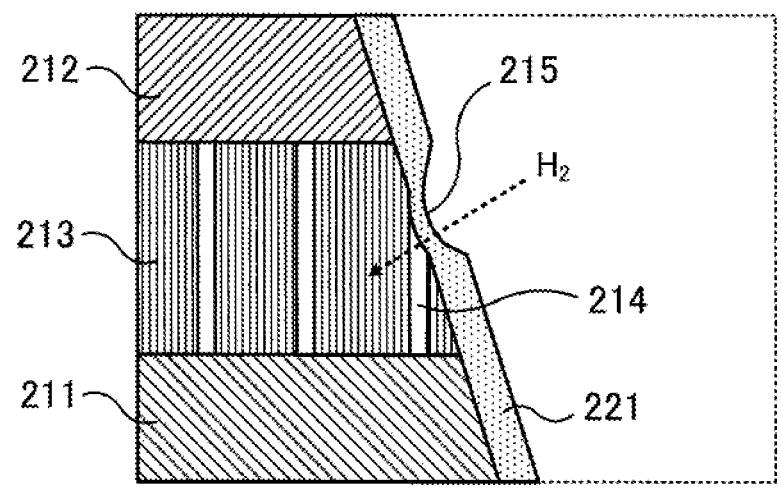

FIG. 13 and FIGS. 14A and 14B are views for describing a seventh formation step of the semiconductor device according to the second embodiment. FIG. 13 is a fragmentary schematic sectional view of an example of a formation step of the semiconductor device. Each of FIGS. 14A and 41B illustrates a comparative example corresponding to the X portion of FIG. 10.

In a step illustrated in FIG. 13, a determined insulating material is deposited to a determined thickness after the above heat treatment in the oxidizing atmosphere. By doing so, the second-layer insulating film 222 which becomes part of the protection film 220A is formed. An insulating material used for forming the second-layer insulating film 222 and the thickness of the second-layer insulating film 222 are adjusted so that the second-layer insulating film 222 will have hydrogen permeability and water permeability lower than the hydrogen permeability and water permeability, respectively, of the first-layer insulating film 221 previously formed. For example, aluminum nitride or aluminum oxynitride is used for forming the second-layer insulating film 222 having a thickness of about several atomic layers to 10 nm. The second-layer insulating film 222 is formed by a process (film formation process) in a non-reducing atmosphere. For example, the second-layer insulating film 222 is formed by the use of the PVD method or CVD method employed in a non-reducing atmosphere.

Alternatively, the second-layer insulating film 222 may be formed by denaturing an outer layer portion of the first-layer insulating film 221 by treatment (denaturation treatment) in a non-reducing atmosphere. For example, the second-layer insulating film 222 is formed by nitriding the outer layer portion of the first-layer insulating film 221 by heat treatment in an atmosphere containing nitrogen. For example, the outer layer portion of the first-layer insulating film 221 made of aluminum oxide is nitrided by heat treatment in an atmosphere containing nitrogen. As a result, the second-layer insulating film 222 made of aluminum nitride or aluminum oxynitride is formed. Furthermore, for example, an outer layer portion of the first-layer insulating film 221 made of silicon oxide is nitrided by heat treatment in an atmosphere containing nitrogen. As a result, the second-layer insulating film 222 made of silicon nitride or silicon oxynitride is formed. The second-layer insulating film 222 having hydrogen permeability and water permeability lower than the hydrogen permeability and water permeability, respectively, of the first-layer insulating film 221 may be formed over the first-layer insulating film 221 (remaining portion after denaturation) by the above denaturation such as nitriding.

The non-reducing atmosphere at the time of forming the second-layer insulating film 222 will now be described with reference to FIGS. 14A and 14B.

As stated above, the first-layer insulating film 221 previously formed has relatively high hydrogen permeability and water permeability in order to discharge hydrogen and water in the ferroelectric capacitor 210 and the buffer film 190 formed under the ferroelectric capacitor 210 by the heat treatment. Accordingly, if a reducing substance, such as hydrogen or water, is contained in an atmosphere (in a material or a carrier) at the time of forming the second-layer insulating film 222, the reducing substance passes through the first-layer insulating film 221, enters the ferroelectric capacitor 210 or the buffer film 190, and diffuses. As a result, the ferroelectric film 213 may be reduced.

Furthermore, as illustrated in FIG. 14A, if metal, such as aluminum, is contained in the first-layer insulating film 221 and the second-layer insulating film 222 is formed, for example, in a reducing atmosphere containing hydrogen, then the first-layer insulating film 221 is reduced with hydrogen (Hz) and a film (conductive film) 221b having conductivity may be formed. If the first-layer insulating film 221 is reduced and the conductive film 221b is formed, then a short circuit may occur between the lower electrode 211 and the upper electrode 212 of the ferroelectric capacitor 210 via the conductive film 221b.

Furthermore, a grain boundary 214 illustrated in FIG. 14B and formed in a crystal growth process resides in the ferroelectric film 213 of the ferroelectric capacitor 210. When patterning is performed on the ferroelectric film 213 as illustrated in FIG. 8D, the grain boundary 214 may be exposed on a side of the ferroelectric film 213. If the first-layer insulating film 221 of the protection film 220A is formed over the ferroelectric capacitor 210 including the ferroelectric film 213 on whose side the grain boundary 214 is exposed, then a portion 215 over the grain boundary 214 of the first-layer insulating film 221 becomes thin. Hydrogen or water is a reducing substance. The hydrogen permeability and water permeability of the thin portion 215 are higher than the hydrogen permeability and water permeability, respectively, of another portion. As illustrated in FIG. 14B, if the second-layer insulating film 222 is formed over the first-layer insulating film 221 including the thin portion 215, example, in a reducing atmosphere containing hydrogen, then the hydrogen ($H_2$) is apt to pass through the thin portion 215. If the ferroelectric film 213 is reduced with hydrogen which passes through the thin portion 215, then the characteristics of the ferroelectric capacitor 210 may deteriorate.

On the other hand, if the second-layer insulating film 222 is formed in a non-reducing atmosphere not containing hydrogen or water, then reduction of the first-layer insulating film 221 with hydrogen or water and a short circuit caused by it are suppressed. Furthermore, if the second-layer insulating film 222 is formed in a non-reducing atmosphere not containing hydrogen or water, then the entrance of hydrogen or water through the first-layer insulating film 221 into the ferroelectric capacitor 210 or the like and reduction of the ferroelectric film 213 caused by it are suppressed. The second-layer insulating film 222 has relatively low hydrogen permeability and water permeability. Therefore, after the second-layer insulating film 222 is formed, the entrance of hydrogen or water from the outside into the inside of the second-layer insulating film 222 (into the side of the insulating film 221, the ferroelectric capacitor 210, or the buffer film 190) is suppressed.

Figure 15:
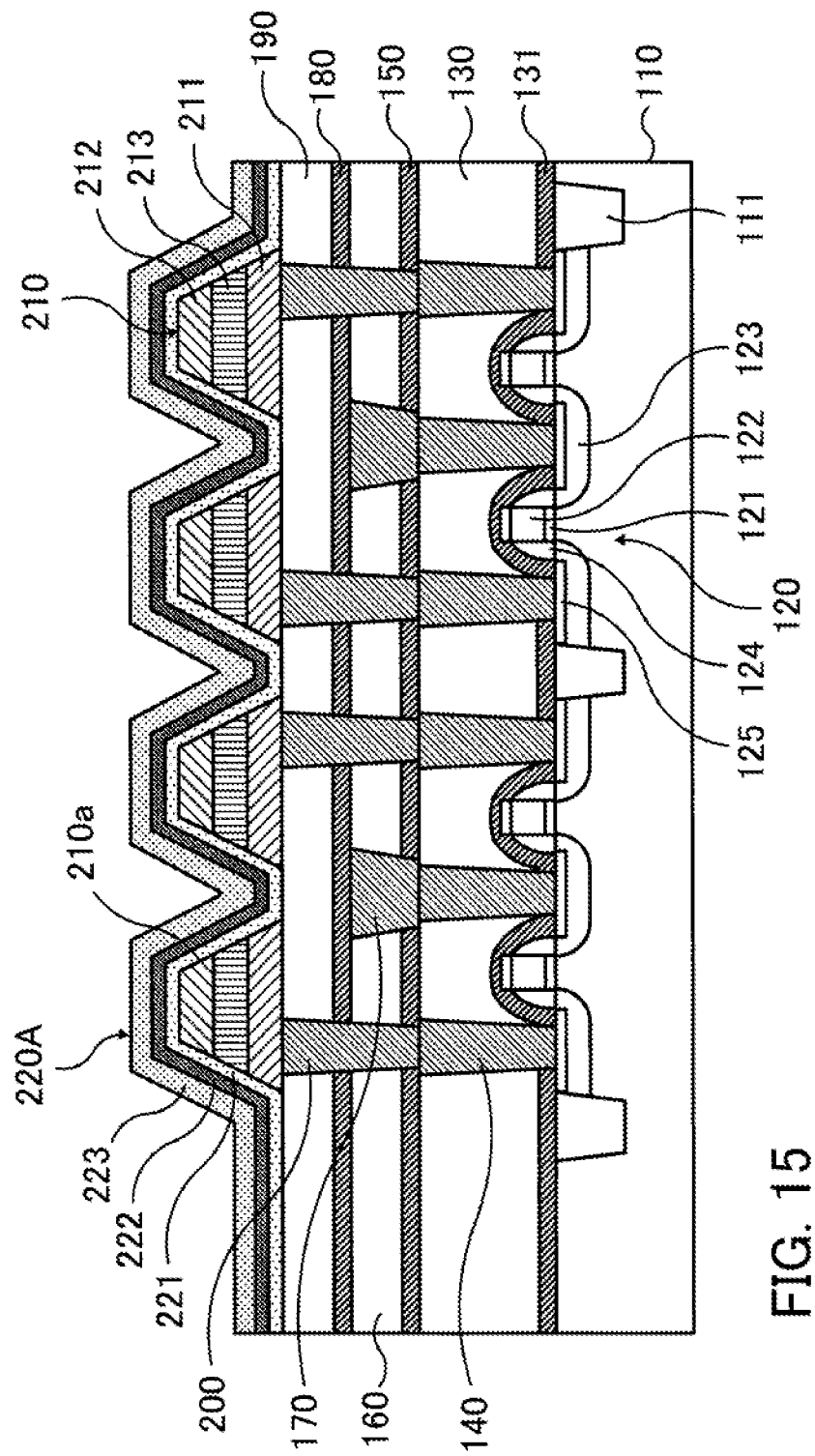
FIG. 15 is a view for describing an eighth formation step of the semiconductor device according to the second embodiment.

FIG. 15 is a view for describing an eighth formation step of the semiconductor device according to the second embodiment. FIG. 15 is a fragmentary schematic sectional view of an example of a formation step of the semiconductor device.

In a step illustrated in FIG. 15, a determined insulating material is deposited to a determined thickness after the formation of the second-layer insulating film 222. By doing so, the third-layer insulating film 223 which becomes part of the protection film 220A is formed. For example, aluminum oxide is used for forming the third-layer insulating film 223 having a thickness of about 10 to 50 nm. For example, the third-layer insulating film 223 is formed by the use of the ALD method with trimethylaluminum (TMA) as a material. At that time a mixed gas of oxygen and ozone is used as an oxidizing gas. With the ALD method an insulating film having high coverage is apt to be formed, compared with the PVD method. Accordingly, the surface of the second-layer insulating film 222 is covered with the third-layer insulating film 223 with good coverage. If the third-layer insulating film 223 is formed by the use of the ALD method, TMA used as a material contains hydrogen which is a reducing substance. This hydrogen may be a reducing substance which reduces the ferroelectric film 213 of the ferroelectric capacitor 210. However, the ferroelectric capacitor 210 is already covered with the second-layer insulating film 222 having relatively low hydrogen permeability and water permeability. Therefore, reduction of the ferroelectric film 213 with hydrogen or water contained in an atmosphere at the time of forming the third-layer insulating film 223 is suppressed.

As described later, the interlayer insulating film 230 is formed over the third-layer insulating film 223. The third-layer insulating film 223 having hydrogen permeability and water permeability lower than the hydrogen permeability and water permeability, respectively, of the interlayer insulating film 230 is formed over the second-layer insulating film 222. As a result, the entrance of hydrogen or water in the interlayer insulating film 230 into the inside of the third-layer insulating film 223 (into the side of the insulating film 221 or 222, the ferroelectric capacitor 210, or the buffer film 190) is suppressed. An insulating material used for forming the third-layer insulating film 223 and the thickness of the third-layer insulating film 223 are adjusted so that the third-layer insulating film 223 will have hydrogen permeability and water permeability lower than the hydrogen permeability and water permeability, respectively, of the interlayer insulating film 230 formed thereover.

As a result, the structure illustrated in FIG. 15 is formed. In this structure, the ferroelectric capacitor 210 is covered with the protection film 220A including the three insulating films 221, 222, and 223.

Figure 16:
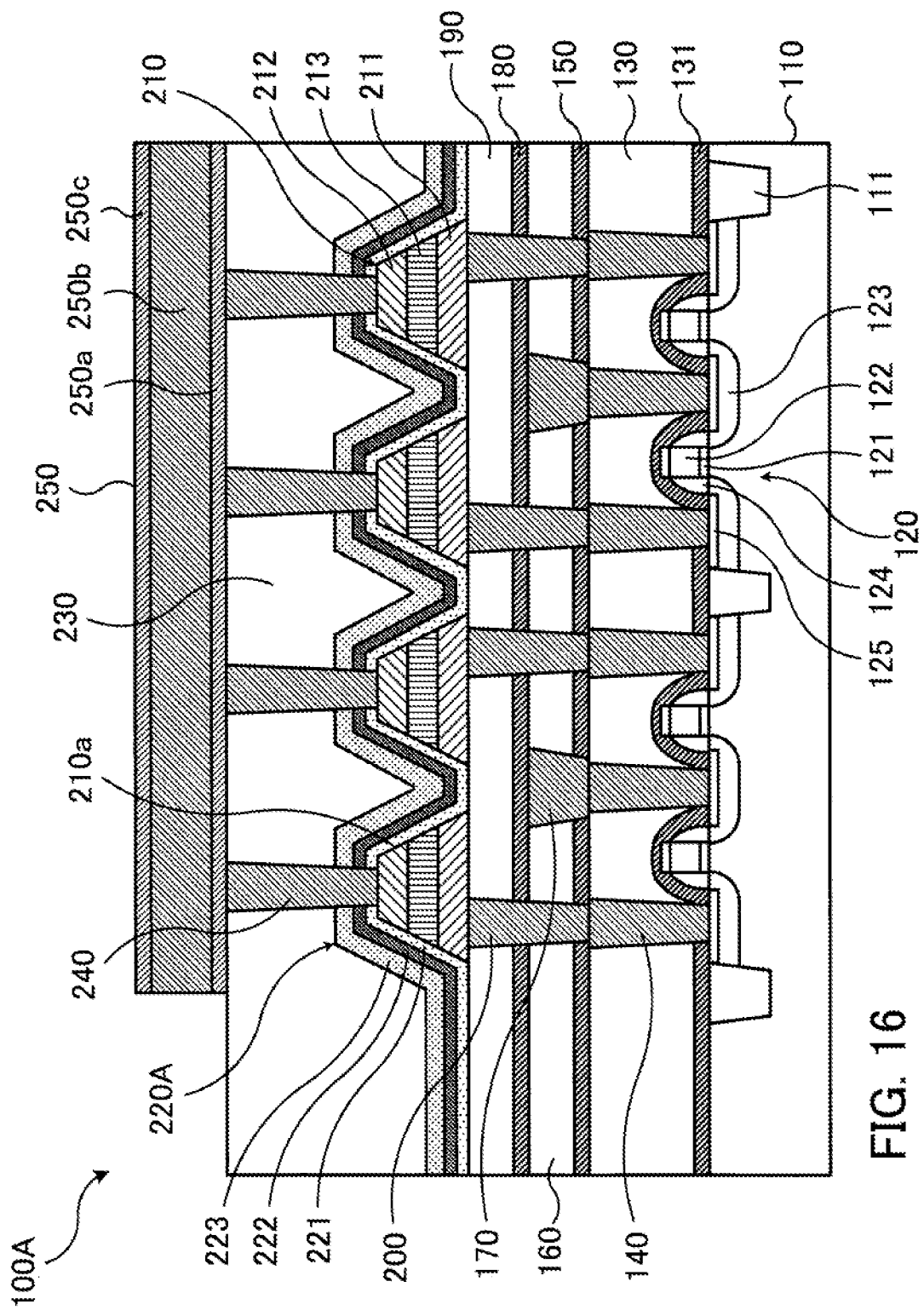
FIG. 16 is a view for describing a ninth formation step of the semiconductor device according to the second embodiment.

FIG. 16 is a view for describing a ninth formation step of the semiconductor device according to the second embodiment. FIG. 16 is a fragmentary schematic sectional view of an example of a formation step of the semiconductor device.

In a step illustrated in FIG. 16, a first interlayer insulating film (part of the interlayer insulating film 230) made mainly of silicon oxide is formed over the protection film 220A by the use of a plasma CVD method using a mixed gas containing TEOS, oxygen, and helium (He) after the formation of the above protection film 220A. For example, the first interlayer insulating film having a thickness of about 1400 nm is formed. In order to suppress deterioration in the characteristics of the ferroelectric capacitor 210, it is desirable to form the first interlayer insulating film under a condition under which hydrogen and water in the first interlayer insulating film are removed. To be concrete, this is realized by adopting a measure such as raising formation temperature, increasing gas pressure, or increasing an oxygen flow rate. After the first interlayer insulating film is formed, the surface of the first interlayer insulating film is planarized by the use of the CMP method. After that, heat treatment is performed on the first interlayer insulating film in a plasma atmosphere generated by the use of nitrous oxide ($N_2O$) and nitrogen or the like. By performing this heat treatment, water in the first interlayer insulating film is removed and the quality of the first interlayer insulating film changes. As a result, the entrance of hydrogen into the first interlayer insulating film is suppressed. Next, a second interlayer insulating film (part of the interlayer insulating film 230) made mainly of silicon oxide is formed over the first interlayer insulating film by the use of the plasma CVD method using a mixed gas containing silane ($SiH_4$), nitrous oxide, and nitrogen. For example, the second interlayer insulating film having a thickness of about 250 nm is formed. As a result, the interlayer insulating film 230 is formed over the protection film 220A which covers the ferroelectric capacitor 210.

Next, a contact hole which pierces the interlayer insulating film 230 and the protection film 220A and which reaches the upper electrode 212 of the ferroelectric capacitor 210 is formed by the use of the photolithography technique and the etching technique. Next, a titanium film and a titanium nitride film which function as an adhesion layer are formed in order on the sides and bottom of the formed contact hole. The contact hole in which the titanium film and the titanium nitride film are formed is filled up with tungsten. Furthermore, an excess titanium film, an excess titanium nitride film, and excess tungsten deposited over the interlayer insulating film 230 are removed by the use of the CMP method. By doing so, the plug 240 is formed. Not only the plug 240 but also other plugs (not illustrated) (plugs and the like connected to plugs and wirings connected to the gate electrode 122) are formed.

Next, the wiring 250 and the like connected to the plug 240 and the like are formed over the interlayer insulating film 230. For example, a barrier film 250a including a titanium film and a titanium nitride film, an aluminum-copper alloy film 250b, and a barrier film 250c including a titanium film and a titanium nitride film are formed in order over the interlayer insulating film 230. Furthermore, patterning is performed on these films by the use of the photolithography technique and the etching technique. As a result, the wiring 250 is formed. Not only the wiring 250 but also other wirings (not illustrated) (wirings and the like connected to plugs and wirings connected to the gate electrode 122) are formed.

As a result, the structure illustrated in FIG. 16 is formed.

For example, the semiconductor device 100A is formed through the above steps. As stated above, with the semiconductor device 100A the first-layer insulating film 221 is formed over the ferroelectric capacitor 210. The first-layer insulating film 221 has a barrier property against a determined element, such as lead, contained in the ferroelectric film 213 and has oxygen permeability, hydrogen permeability, and water permeability. The second-layer insulating film 222 is formed over the first-layer insulating film 221 in the non-reducing atmosphere. The second-layer insulating film 222 has hydrogen permeability and water permeability lower than the hydrogen permeability and water permeability, respectively, of the first-layer insulating film 221. The third-layer insulating film 223 is formed over the second-layer insulating film 222. The third-layer insulating film 223 has hydrogen permeability and water permeability lower than the hydrogen permeability and water permeability, respectively, of the interlayer insulating film 230. By forming the protection film 220A including the three insulating films 221, 222, and 223, degradation of the ferroelectric film 213 under and after the formation of the semiconductor device 100A is suppressed and deterioration in the characteristics of the ferroelectric capacitor 210 is suppressed. As a result, a high performance and high-quality semiconductor device 100A with the ferroelectric capacitor 210 having excellent characteristics is realized.

Third Embodiment

A second example of the semiconductor device in which the structure described in the above first embodiment is adopted will now be described as a third embodiment.

Figure 17:
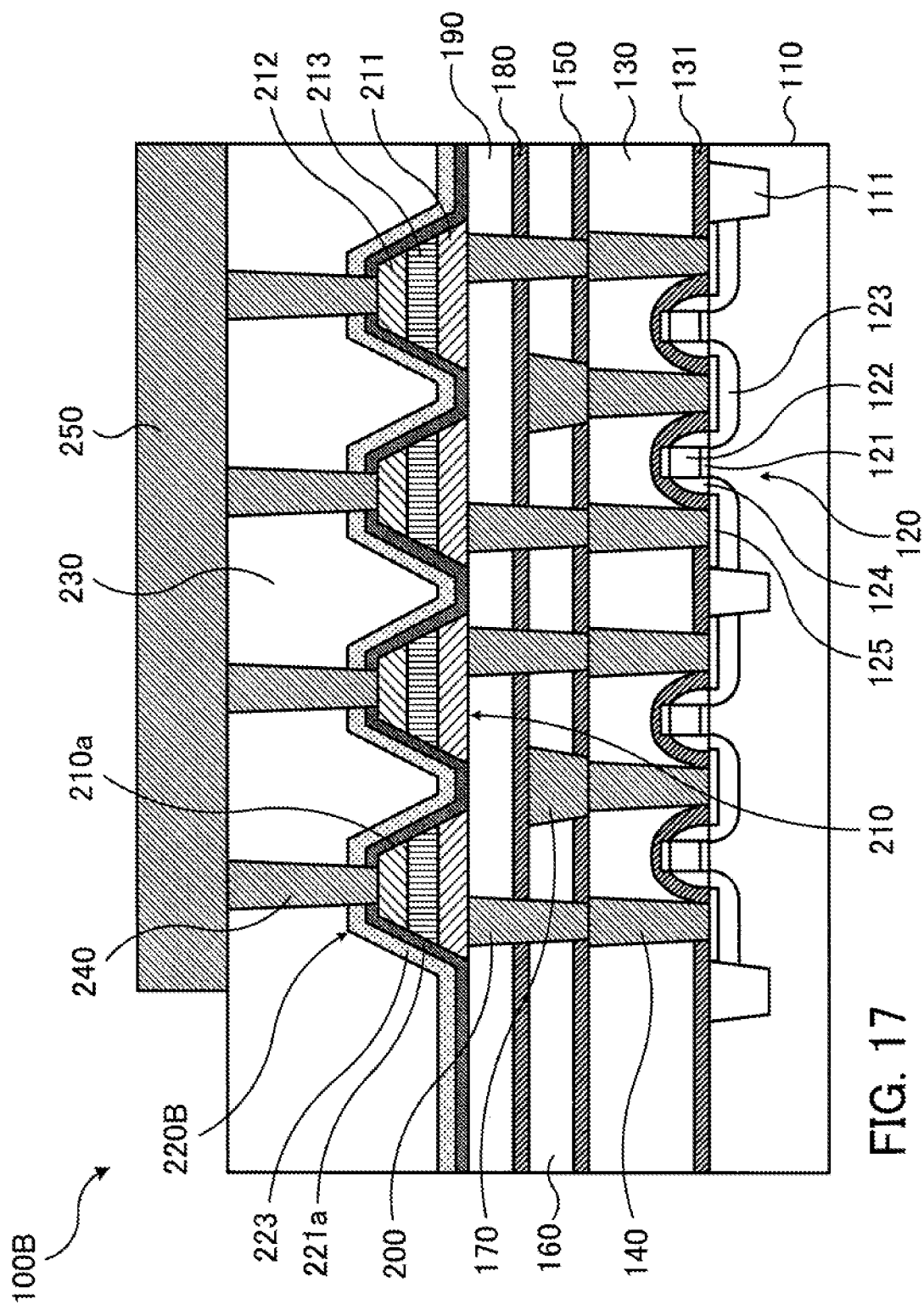
FIG. 17 is a view for describing an example of a semiconductor device according to a third embodiment.

FIG. 17 is a view for describing an example of a semiconductor device according to a third embodiment. FIG. 17 is a fragmentary schematic sectional view of an example of a semiconductor device.

A semiconductor device 100B illustrated in FIG. 17 differs from the semiconductor device 100A described in the above second embodiment in that it has a structure in which a ferroelectric capacitor 210 is covered with a protection film 220B including two insulating films 221a and 223. The first-layer insulating film 221a of the protection film 220B is formed by denaturing the first-layer insulating film 221 described in the above second embodiment by treatment in a non-reducing atmosphere.

A method for forming the semiconductor device 100B will now be described.

Figure 18:
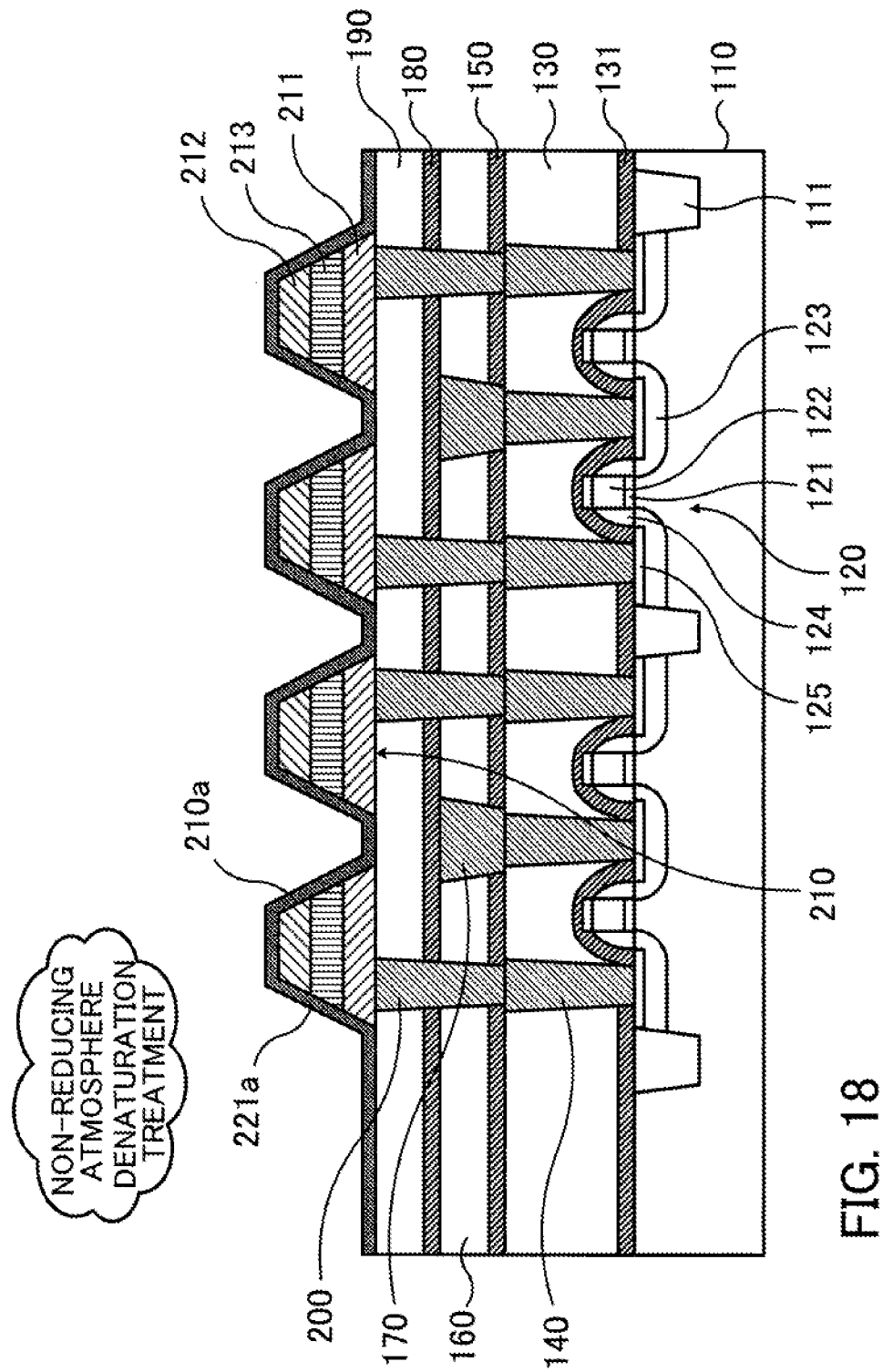
FIG. 18 is a view for describing a first formation step of the semiconductor device according to the third embodiment.

FIG. 18 is a view for describing a first formation step of the semiconductor device according to the third embodiment. FIG. 18 is a fragmentary schematic sectional view of an example of a formation step of the semiconductor device.

The same steps that are described in FIGS. 4 through 10 in the above second embodiment are used for forming the semiconductor device 100B. The semiconductor device 100B is formed in the following way. As illustrated in FIG. 9, the first-layer insulating film 221 is formed. As illustrated in FIG. 10, heat treatment (recovery anneal) is performed in an oxidizing atmosphere. After that, as illustrated in FIG. 18, the first-layer insulating film 221 is denatured by treatment in a non-reducing atmosphere. For example, the whole of the first-layer insulating film 221 formed over the ferroelectric capacitor 210 (and a buffer film 190) is nitrided by heat treatment in an atmosphere containing nitrogen. For example, the whole of the first-layer insulating film 221 made of aluminum oxide is nitrided by heat treatment in an atmosphere containing nitrogen. As a result, a second-layer insulating film 222 made of aluminum nitride or aluminum oxynitride is formed. Alternatively, for example, the whole of the first-layer insulating film 221 made of silicon oxide is nitrided by heat treatment in an atmosphere containing nitrogen. As a result, a second-layer insulating film 222 made of silicon nitride or silicon oxynitride is formed. By performing the above treatment, the insulating film 221a which is illustrated in FIG. 18 and which covers the ferroelectric capacitor 210 is formed. As a result, the first-layer insulating film 221 is denatured to the insulating film 221a having hydrogen permeability and water permeability lower than the hydrogen permeability and water permeability, respectively, of the first-layer insulating film 221.

If the first-layer insulating film 221 is denatured by treatment in a reducing atmosphere, then the same that is described in the above second embodiment with the case where the second-layer insulating film 222 is formed in the reducing atmosphere (FIGS. 14A and 14B) may occur. That is to say, a short circuit of the ferroelectric capacitor 210 or reduction of a ferroelectric film 213 may occur. Accordingly, treatment for denaturing the first-layer insulating film 221 to the insulating film 221a having hydrogen permeability and water permeability lower than the hydrogen permeability and water permeability, respectively, of the first-layer insulating film 221 is performed in the non-reducing atmosphere.

As stated above, the heat treatment is performed in the oxidizing atmosphere on the first-layer insulating film 221 formed over the ferroelectric capacitor 210. After that, the first-layer insulating film 221 is denatured by the treatment in the non-reducing atmosphere. As a result, the first-layer insulating film 221a which becomes part of the protection film 220B is formed.

Figure 19:
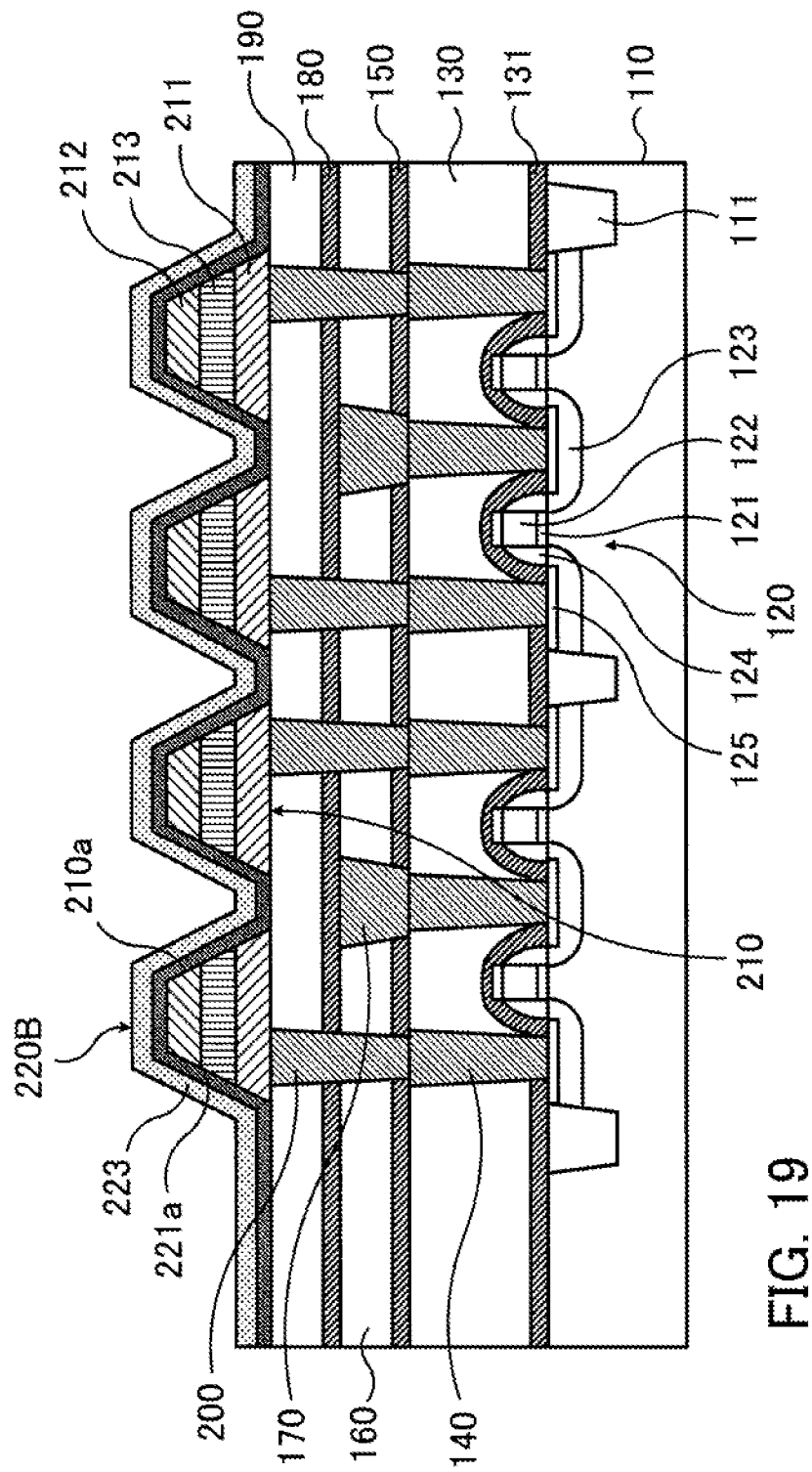
FIG. 19 is a view for describing a second formation step of the semiconductor device according to the third embodiment.

FIG. 19 is a view for describing a second formation step of the semiconductor device according to the third embodiment. FIG. 19 is a fragmentary schematic sectional view of an example of a formation step of the semiconductor device.

In a step illustrated in FIG. 19, after the above denatured insulating film 221a is formed, a determined insulating material is deposited to a determined thickness. By doing so, the second-layer insulating film 223 which becomes part of the protection film 220B is formed. This is the same with the step illustrated in FIG. 15. An insulating material used for forming the second-layer insulating film 223 and the thickness of the second-layer insulating film 223 are adjusted so that the second-layer insulating film 223 will have hydrogen permeability and water permeability lower than the hydrogen permeability and water permeability, respectively, of an interlayer insulating film 230 formed thereover. As a result, the structure illustrated in FIG. 19 is formed. That is to say, the ferroelectric capacitor 210 is covered with the protection film 220B including the two insulating films 221a and 223.

After the protection film 220B is formed, the interlayer insulating film 230, a plug 240 and the like, and a wiring 250 and the like are formed. This is the same with the step of FIG. 16 described in the above second embodiment.

For example, the semiconductor device 100B illustrated in FIG. 17 is formed through the above steps. Because the protection film 220B including the above two insulating films 221a and 223 is formed, degradation of the ferroelectric film 213 under and after the formation of the semiconductor device 100B is suppressed and deterioration in the characteristics of the ferroelectric capacitor 210 is suppressed. As a result, a high performance and high-quality semiconductor device 100B with the ferroelectric capacitor 210 having excellent characteristics is realized.

Fourth Embodiment

Figure 20:
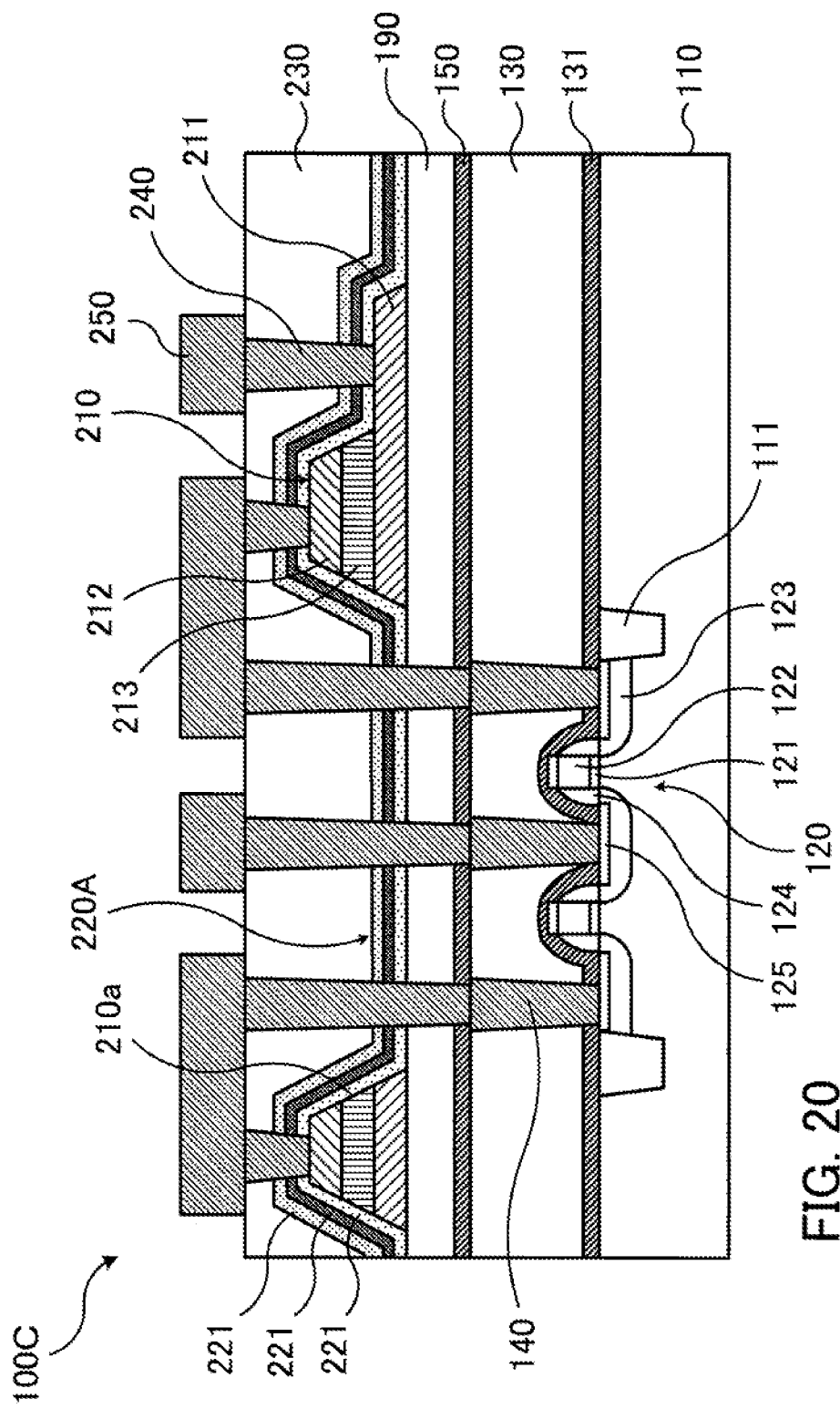
FIG. 20 is a view for describing an example of a semiconductor device according to a fourth embodiment.

FIG. 20 is a view for describing an example of a semiconductor device according to a fourth embodiment. FIG. 20 is a fragmentary schematic sectional view of an example of a semiconductor device.

A semiconductor device 100C illustrated in FIG. 20 differs from the semiconductor device 100A described in the above second embodiment in that a planar structure is adopted. That is to say, with the semiconductor device 100C a bit line (and word line and a plate line) is arranged above a ferroelectric capacitor 210.

With the semiconductor device 100C, for example, a buffer film 190 is formed over an etching stopper film 150 and the ferroelectric capacitor 210 is formed over the buffer film 190. For example, patterning is performed on the ferroelectric capacitor 210 formed over the buffer film 190 as illustrated in FIGS. 8A through 8C so that at least a lower electrode 211 will have a shape extending to the outside of a ferroelectric film 213. As a result, the ferroelectric capacitor 210 with tiers illustrated in FIG. 20 is formed.

In accordance with the example described in the above second embodiment, for example, a protection film 220A including three insulating films 221, 222, and 223 is formed over the ferroelectric capacitor 210 (and the buffer film 190) formed in this way. Furthermore, an interlayer insulating film 230 is formed over the formed protection film 220A. In addition, plugs 240 which pierce the interlayer insulating film 230 and the protection film 220A and which are connected to an upper electrode 212 and the lower electrode 211 of the ferroelectric capacitor 210 are formed. Moreover, plugs 240 which pierce the interlayer insulating film 230, the protection film 220A, the buffer film 190, and the etching stopper film 150 and which are connected to plugs 140 and the like connected to a transistor 120 are formed. Wirings 250 connected to these plugs 240 are formed over the interlayer insulating film 230.

As a result, the semiconductor device 100C having the planar structure illustrated in FIG. 20 is obtained.

The protection film 220A including the three insulating films 221, 222, and 223 described in the above second embodiment may also be formed over the ferroelectric capacitor 210 of the above semiconductor device 100C having the planar structure. As a result, degradation of the ferroelectric film 213 under and after the formation of the semiconductor device 100C is suppressed and deterioration in the characteristics of the ferroelectric capacitor 210 is suppressed. Accordingly, a high performance and high-quality semiconductor device 100C with the ferroelectric capacitor 210 having excellent characteristics is realized.

The protection film 220A including the three insulating films 221, 222, and 223 described in the above second embodiment is taken as an example. However, the protection film 220B including the two insulating films 221a and 223 described in the above third embodiment may be applied.

Fifth Embodiment

For example, the semiconductor devices 1A and 1B, 100A, 100B, 100C described in the above first through fourth embodiments, respectively, are mounted in various electronic parts such as circuit boards and other semiconductor devices.

Figure 21:
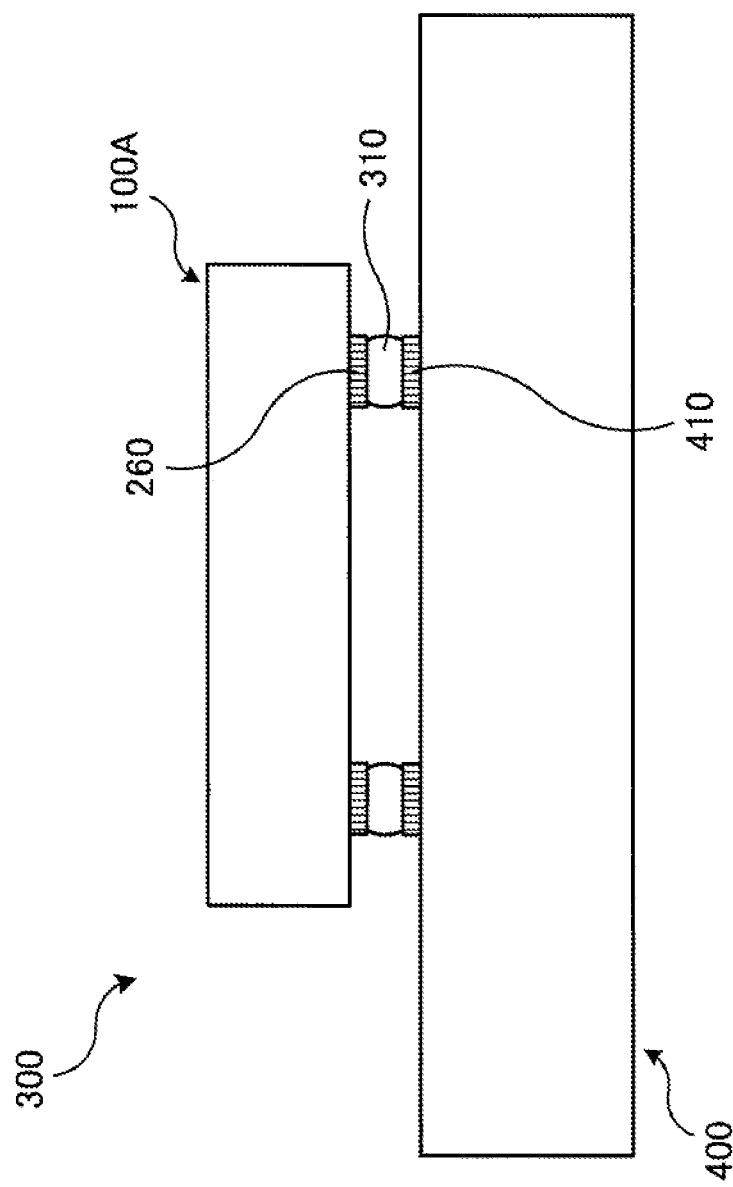
FIG. 21 is a view for describing an example of an electronic device according to a fifth embodiment.

FIG. 21 is a view for describing an example of an electronic device according to a fifth embodiment. FIG. 21 is a fragmentary schematic sectional view of an example of an electronic device.

An electronic device 300 illustrated in FIG. 21 has a structure in which, for example, the semiconductor device 100A (FIG. 3 or FIG. 16) having the structure described in the above second embodiment is mounted over a circuit board 400.

For example, the semiconductor device 100A takes the form of a semiconductor chip or semiconductor package having the structure illustrated in FIG. 3 or FIG. 16. Terminals 260 connected to internal circuits (sense amplifier, a row decoder, a control circuit, and a peripheral circuit) are formed on the surface of the semiconductor device 100A opposite the circuit board 400. Terminals 410 are formed on the circuit board 400 at positions corresponding to the terminals 260 of the semiconductor device 100A. Conductor portions (wirings, through holes, and the like) connected to the terminals 410 are formed in the outer layer portion of the circuit board 400 and in the circuit board 400. The semiconductor device 100A having the above structure is placed opposite the circuit board 400 having the above structure and the terminals 260 are bonded to the terminals 410 by the use of a bonding material, such as solder, 310. As a result, the electronic device 300 is formed.

With the semiconductor device 100A (FIG. 3 or FIG. 16), degradation of the ferroelectric film 213 under and after the formation of the semiconductor device 100A and deterioration in the characteristics of the ferroelectric capacitor 210 are suppressed by the above protection film 220A. As a result, a high performance and high-quality semiconductor device 100A with the ferroelectric capacitor 210 having excellent characteristics is realized. This semiconductor device 100A is mounted over the circuit board 400 and the electronic device 300 with high performance and high reliability is realized.

In the above example, the semiconductor device 100A is mounted over the circuit board 400. However, for example, the semiconductor device 1A, 1B, 100B, or 100C may be mounted over the circuit board 400 in the same way. Furthermore, in the above example, the circuit board 400 is used. However, the semiconductor devices 1A, 1B, 100A, 100B, and 100C, for example, may be mounted over various electronic parts such as other semiconductor devices (semiconductor chips and semiconductor packages).

Sixth Embodiment

For example, the semiconductor devices 1A and 1B, 100A, 100B, 100C described in the above first through fourth embodiments, respectively, and the electronic device 300 described in the above fifth embodiment are mounted in various electronic equipment (also referred to as electronic devices) such as computers (personal computers, supercomputers, servers, and the like), smartphones, portable telephones, tablet terminals, sensors, cameras, audio equipment, measuring equipment, inspection equipment, and manufacturing equipment.

Figure 22:
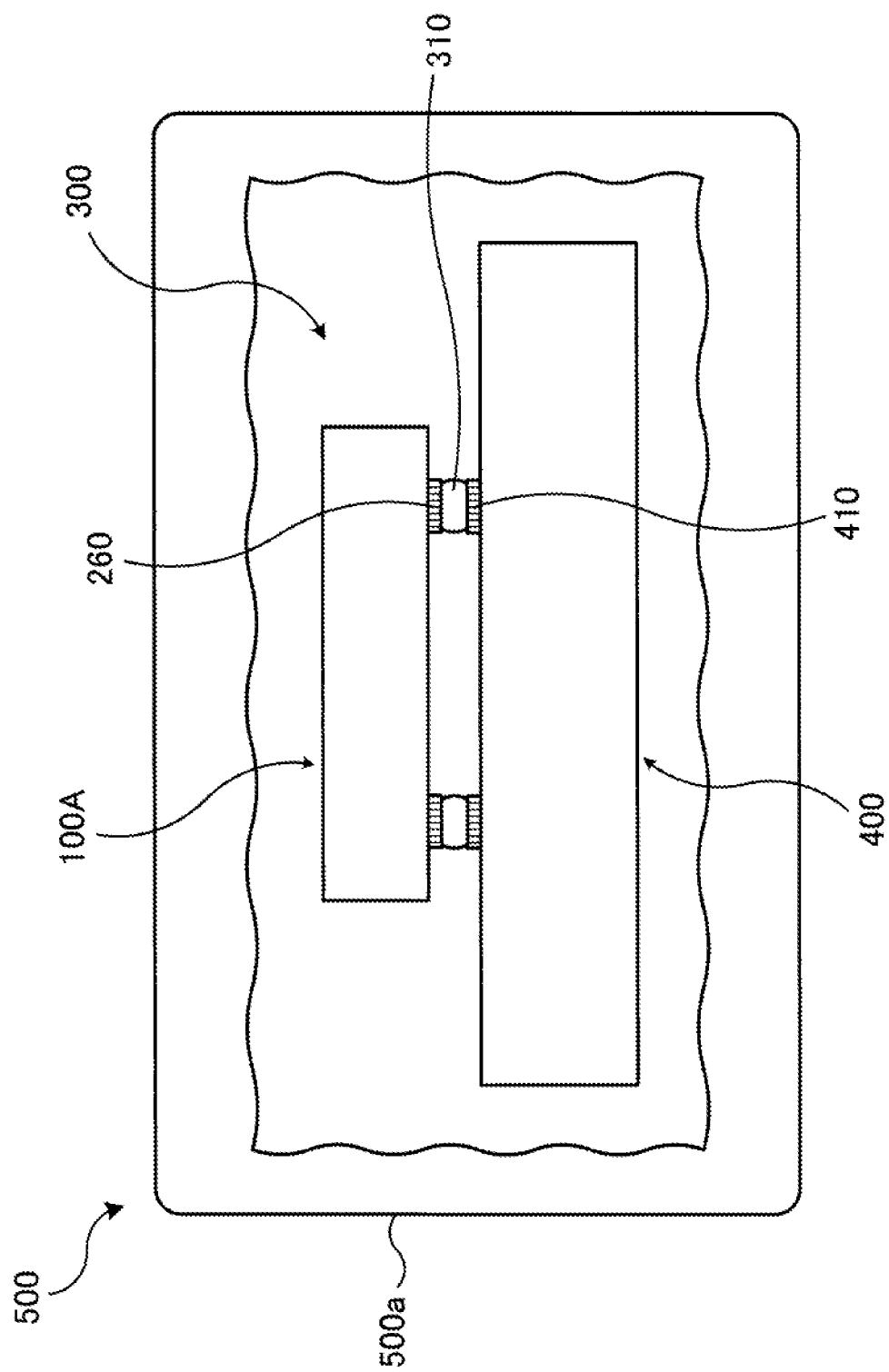
FIG. 22 is a view for describing an example of electronic equipment according to a sixth embodiment.

FIG. 22 is a view for describing an example of electronic equipment according to a sixth embodiment. FIG. 22 schematically illustrates electronic equipment.

As illustrated in FIG. 22, for example, the electronic device 300 (FIG. 21) described in the above fifth embodiment is mounted (incorporated) in an enclosure 500a of electronic equipment 500. The electronic device 300 may be housed in a rack or slot of the electronic equipment 500.

With the semiconductor device 100A (FIG. 3 or FIG. 16), degradation of the ferroelectric film 213 under and after the formation of the semiconductor device 100A and deterioration in the characteristics of the ferroelectric capacitor 210 are suppressed by the above protection film 220A. As a result, a high performance and high-quality semiconductor device 100A with the ferroelectric capacitor 210 having excellent characteristics is realized. This semiconductor device 100A is mounted over the circuit board 400 and the electronic device 300 with high performance and high reliability is realized. Furthermore, this electronic device 300 is mounted and the electronic equipment 500 with high performance and high reliability is realized.

In the above example, the electronic device 300 is mounted in the electronic equipment 500. However, for example, an electronic device in which the semiconductor device 1A, 1B, 100A, 100B, 100C, or the like is mounted over an electronic part other than the circuit board 400 may be mounted in various electronic equipment.

According to an aspect, deterioration in the characteristics of a ferroelectric capacitor is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a substrate;
   a ferroelectric capacitor formed over the substrate;
   a first insulating film formed over a surface of the ferroelectric capacitor, having a barrier property against a first element contained in the ferroelectric capacitor, and having an oxygen permeability, a hydrogen permeability, and a water permeability;
   a second insulating film formed over a surface of the first insulating film and having a hydrogen permeability and a water permeability lower than the hydrogen permeability and the water permeability, respectively, of the first insulating film;
   a third insulating film formed over a surface of the second insulating film; and
   an interlayer insulating film formed over a surface of the third insulating film and having a hydrogen permeability and a water permeability higher than a hydrogen permeability and a water permeability, respectively, of the third insulating film.

2. The semiconductor device according to claim 1, wherein the second insulating film contains nitrogen or carbon.

3. A semiconductor device fabrication method comprising:
   forming a ferroelectric capacitor over a substrate;
   forming over a surface of the ferroelectric capacitor a first insulating film having a barrier property against a first element contained in the ferroelectric capacitor and having an oxygen permeability, a hydrogen permeability, and a water permeability;
   performing a heat treatment in an oxidizing atmosphere after the forming of the first insulating film;
   forming over a surface of the first insulating film in a non-reducing atmosphere a second insulating film having a hydrogen permeability and a water permeability lower than the hydrogen permeability and the water permeability, respectively, of the first insulating film after the performing of the heat treatment, the second insulating film containing nitrogen or carbon; and
   forming a third insulating film over a surface of the second insulating film.

4. The semiconductor device fabrication method according to claim 3, wherein the forming of the second insulating film includes forming the second insulating film by nitriding an outer layer portion of the first insulating film by a heat treatment in an atmosphere containing nitrogen.

5. The semiconductor device fabrication method according to claim 3, further comprising:
   forming over a surface of the third insulating film an interlayer insulating film having a hydrogen permeability and a water permeability higher than a hydrogen permeability and a water permeability, respectively, of the third insulating film.

6. A semiconductor device fabrication method comprising:
   forming a ferroelectric capacitor over a substrate;
   forming over a surface of the ferroelectric capacitor a first insulating film having a barrier property against a first element contained in the ferroelectric capacitor and having an oxygen permeability, a hydrogen permeability, and a water permeability;
   performing a heat treatment in an oxidizing atmosphere after the forming of the first insulating film;
   forming, after the performing of the heat treatment, a second insulating film having a hydrogen permeability and a water permeability lower than the hydrogen permeability and the water permeability, respectively, of the first insulating film by denaturing the first insulating film in a non-reducing atmosphere; and
   forming a third insulating film over a surface of the second insulating film.

7. The semiconductor device fabrication method according to claim 6, wherein the second insulating film contains nitrogen or carbon.

8. The semiconductor device fabrication method according to claim 6, wherein the forming of the second insulating film includes forming the second insulating film by denaturing the first insulating film by nitriding the first insulating film by a heat treatment in an atmosphere containing nitrogen.

9. The semiconductor device fabrication method according to claim 6, further comprising:
   forming over a surface of the third insulating film an interlayer insulating film having a hydrogen permeability and a water permeability higher than a hydrogen permeability and a water permeability, respectively, of the third insulating film.

* * * * *